US011481053B2

(12) United States Patent
Kim et al.

(10) Patent No.: US 11,481,053 B2
(45) Date of Patent: Oct. 25, 2022

(54) DISPLAY DEVICE AND TOUCH SENSOR INCLUDING TOUCH SENSING ELECTRODES

(71) Applicant: SAMSUNG DISPLAY CO., LTD., Yongin-si (KR)

(72) Inventors: Jung Hak Kim, Hwaseong-si (KR); Do Ik Kim, Suwon-si (KR); Gwang Bum Ko, Suwon-si (KR); Ga Young Kim, Hwaseong-si (KR); Young Sik Kim, Yongin-si (KR); Sang Chul Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/363,345

(22) Filed: Mar. 25, 2019

(65) Prior Publication Data

US 2019/0332212 A1   Oct. 31, 2019

(30) Foreign Application Priority Data

Apr. 27, 2018  (KR) .......................... 10-2018-0049201

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
None
See application file for complete search history.

(56) References Cited

U.S. PATENT DOCUMENTS 11,003,292 B2 * 5/2021 Kim ...................... G06F 3/0443
2011/0032193 A1 * 2/2011 Szalkowski ........... G06F 3/0445
345/173

(Continued)

FOREIGN PATENT DOCUMENTS

EP         3200053       8/2017
KR     1020170056798    5/2017
(Continued)

OTHER PUBLICATIONS

European Office Action issued in corresponding European Patent Application No. EP19168651.8 on Nov. 16, 2021.
(Continued)

*Primary Examiner* — Andre L Matthews
(74) *Attorney, Agent, or Firm* — F. Chau & Associates, LLC

(57) ABSTRACT

A touch sensor includes a base layer and a plurality of first touch electrodes disposed on the base layer. The plurality of first touch electrodes are arranged in a first direction. The plurality of first touch electrodes include openings, and are electrically connected to one another. A plurality of second touch electrodes are disposed on the base layer. The plurality of second touch electrodes are arranged in a second direction. The plurality of second touch electrodes are electrically connected to one another. First pressure sensing electrodes and second pressure sensing electrodes are separated from each other and are disposed in the openings. The pressure sensing electrodes and second pressure sensing electrodes are spaced apart from the first touch electrodes. The first pressure sensing electrodes, the second pressure sensing electrodes, the first touch electrodes, and the second touch electrodes are all disposed in a first layer.

19 Claims, 28 Drawing Sheets

(51) Int. Cl.
*H01L 27/32* (2006.01)
*H01L 51/52* (2006.01)

(52) U.S. Cl.
CPC ........ *G06F 3/04144* (2019.05); *H01L 27/323* (2013.01); *H01L 51/5256* (2013.01); *G06F 2203/04104* (2013.01)

(56) References Cited

U.S. PATENT DOCUMENTS

| | | | |
|---|---|---|---|
| 2014/0062933 A1 | 3/2014 | Coulson et al. | |
| 2016/0195955 A1 | 7/2016 | Picciotto et al. | |
| 2016/0364057 A1 | 12/2016 | Chi et al. | |
| 2017/0010704 A1* | 1/2017 | Chen | G02F 1/134309 |
| 2017/0115813 A1* | 4/2017 | Chen | G06F 3/0446 |
| 2017/0269763 A1 | 9/2017 | Yang | |
| 2017/0300157 A1* | 10/2017 | Lu | G06F 3/04166 |
| 2017/0344141 A1* | 11/2017 | Lee | G06F 3/04164 |
| 2017/0371471 A1 | 12/2017 | Kim et al. | |
| 2018/0018044 A1 | 1/2018 | Hong et al. | |
| 2018/0321793 A1* | 11/2018 | Kim | G06F 3/0418 |
| 2018/0329555 A1* | 11/2018 | Kim | G06F 3/0412 |
| 2019/0113993 A1 | 4/2019 | Lee | |
| 2019/0354241 A1* | 11/2019 | Kim | G06F 3/0443 |
| 2020/0319735 A1* | 10/2020 | Kim | G06F 3/045 |

FOREIGN PATENT DOCUMENTS

| | | |
|---|---|---|
| KR | 1020170091213 | 8/2017 |
| KR | 1020170119002 | 10/2017 |
| KR | 1020170121904 | 11/2017 |
| KR | 10-2017-0133567 | 12/2017 |

OTHER PUBLICATIONS

European Search Report dated Aug. 1, 2019 in corresponding European Patent Application No. 19168651.8 (12 pages).
Korean Office Action issued in corresponding Korean Patent Application No. 10-2018-0049201 dated Jun. 2, 2022.

* cited by examiner

DISPLAY DEVICE AND TOUCH SENSOR INCLUDING TOUCH SENSING ELECTRODES

CROSS-REFERENCE TO RELATED APPLICATION

This application claims priority under 35 U.S.C. § 119 to Korean Patent Application No. 10-2018-0049201, filed on Apr. 27, 2018, the disclosure of which is incorporated by reference herein in its entirety.

TECHNICAL FIELD

Exemplary embodiments of the present invention relate to a touch sensor and a display device, and more particularly, to a touch sensor and a display device including touch sensing electrodes.

DISCUSSION OF RELATED ART

Electronic devices such as a smartphone, a tablet personal computer (PC), a digital camera, a notebook computer, a navigation system, and a smart television (TV), which provide images to users, may include a display device for displaying images. Display devices may include a display panel generating and displaying images and various input devices.

Recently, touch sensors recognizing a touch input have been employed in display devices, for example, in Smartphones or tablet PCs. Touch sensors have increasingly replaced existing physical input devices such as keypads.

There has been research into ways to apply not only touch sensors for detecting a touch location, but also pressure sensors for detecting the intensity of pressure applied to display devices. Thus, pressure sensors may be used to replace physical buttons in display devices.

SUMMARY

Exemplary embodiments of the present invention provide a touch sensor capable of sensing pressure.

Exemplary embodiments of the present invention provide a touch sensor capable of increasing touch sensitivity and detecting pressure.

According to an exemplary embodiment of the present invention, a touch sensor includes a base layer and a plurality of first touch electrodes disposed on the base layer. The plurality of first touch electrodes are arranged in a first direction. The plurality of first touch electrodes include openings, and are electrically connected to one another. A plurality of second touch electrodes are disposed on the base layer. The plurality of second touch electrodes are arranged in a second direction, which intersects the first direction. The plurality of second touch electrodes are electrically connected to one another. First pressure sensing electrodes and second pressure sensing electrodes are separated from each other and are disposed in the openings of the first touch electrodes in a plan view. The pressure sensing electrodes and second pressure sensing electrodes are spaced apart from the first touch electrodes. The first pressure sensing electrodes, the second pressure sensing electrodes, the first touch electrodes, and the second touch electrodes are all disposed in a first layer.

According to an exemplary embodiment of the present invention, a touch sensor includes a base layer and first electrodes disposed on the base layer. The first electrodes are arranged in a first direction, and include openings. Second electrodes are disposed on the base layer and are arranged in a second direction, which intersects the first direction. Third electrodes and fourth electrodes are disposed in the openings of the first electrodes in a plan view. The third and fourth electrodes are spaced apart from the first electrodes, and are separated from each other. Each of the third electrodes includes a first stem electrode and a plurality of first branch electrodes branched off from the first stem electrode. Each of the fourth electrodes includes a second stem electrode and a plurality of second branch electrodes branched off from the second stem electrode. The first branch electrodes and the second branch electrodes are spaced apart from each other.

According to an exemplary embodiment of the present invention, a touch sensor includes a base layer and a plurality of first touch electrodes disposed on the base layer. The plurality of first touch electrodes are arranged in a first direction, and include openings. The plurality of first touch electrodes are electrically connected to one another. A plurality of second touch electrodes are disposed on the base layer. The plurality of second touch electrodes are arranged in a second direction, which intersects the first direction. The plurality of second touch electrodes are electrically connected to one another. First pressure sensing electrodes are disposed in the openings of the first touch electrodes in a plan view to be spaced apart from the first touch electrodes. The first pressure sensing electrodes are disposed in a same first layer as the first touch electrodes and the second touch electrodes. An insulating layer is disposed on the first pressure sensing electrodes. The insulating layer has elasticity. Second pressure sensing electrodes are disposed on the insulating layer. A controller is electrically connected to the first touch electrodes, the second touch electrodes, the first pressure sensing electrodes, and the second pressure sensing electrodes. The controller detects a touch location by detecting a variation in static capacitance between the first touch electrodes and the second touch electrodes during a first time period. The controller detects touch pressure by detecting a variation in static capacitance between the first pressure sensing electrodes and the second pressure sensing electrodes during a second time period, which at least partially does not overlap with the first time period.

According to an exemplary embodiment of the present invention, a display device includes a display panel including a base substrate, a thin film transistor positioned above the base substrate, an emission layer electrically connected with the thin film transistor, and a thin film encapsulation layer positioned above the emission layer. A sensor unit is disposed directly on the thin film encapsulation layer. The sensor unit includes a plurality of first touch electrodes disposed on the thin film encapsulation layer. The plurality of first touch electrodes are arranged in a first direction. The plurality of first touch electrodes include openings. The plurality of first touch electrodes are electrically connected to one another. A plurality of second touch electrodes are disposed on the thin film encapsulation layer. The plurality of second touch electrodes are arranged in a second direction, which intersects the first direction. The plurality of second touch electrodes are electrically connected to one another. First pressure sensing electrodes and second pressure sensing electrodes are separated from each other and are disposed in the openings of the first touch electrodes in a plan view. The first pressure sensing electrodes and second pressure sensing electrodes are spaced apart from the first touch electrodes. The first pressure sensing electrodes, the second pressure sensing electrodes, the first touch electrodes, and the second touch electrodes are each in direct contact with the thin film encapsulation layer.

According to an exemplary embodiment of the present invention, sensitivity of a touch sensor can be increased.

BRIEF DESCRIPTION OF THE DRAWINGS

The above and other aspects and features of the present invention will become more apparent by describing in detail exemplary embodiments thereof with reference to the accompanying drawings, in which.

DETAILED DESCRIPTION

Figure 1:
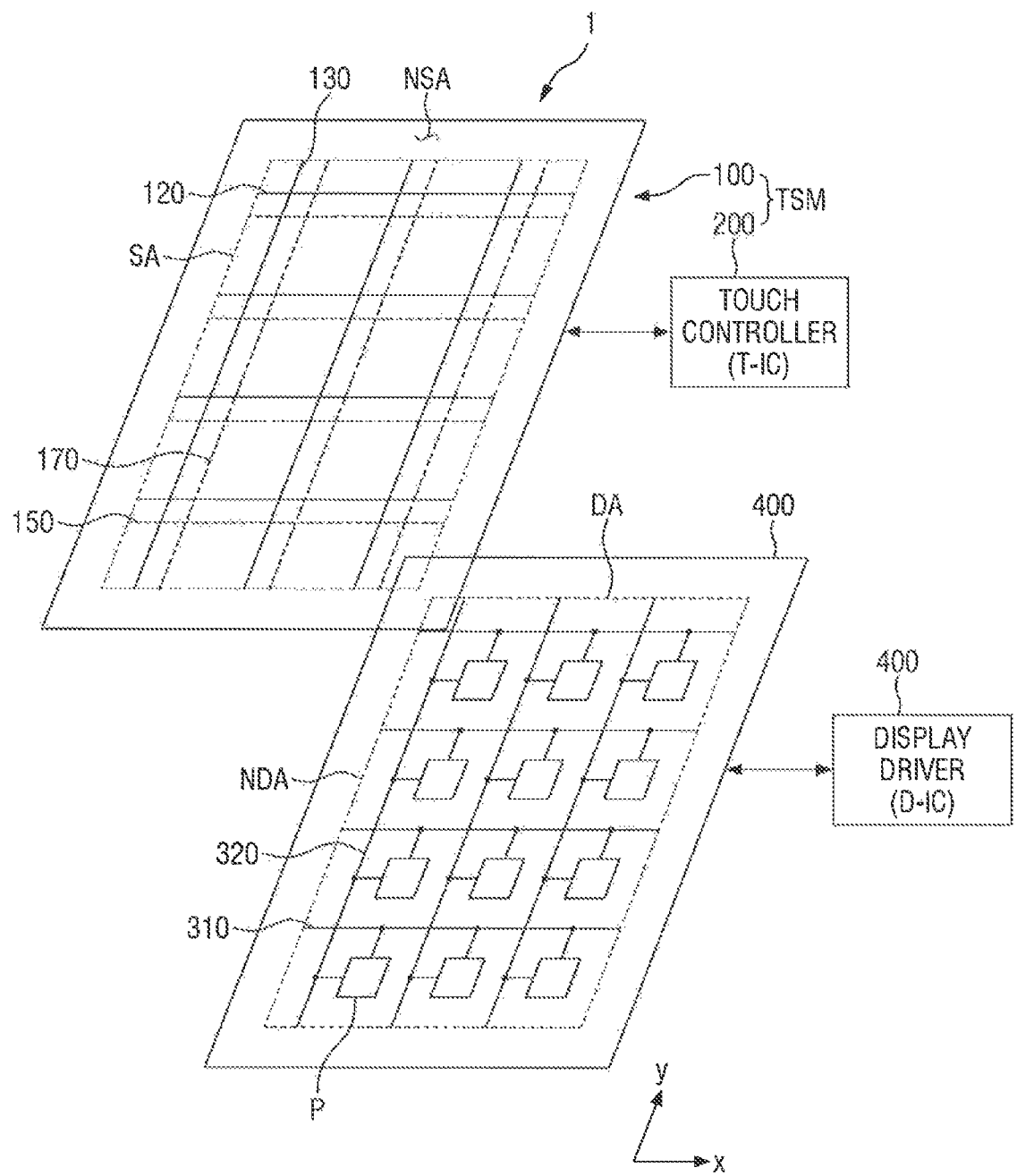
FIG. 1 is a schematic view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

As used herein, the singular forms "a", "an" and "the" may include the plural forms as well, unless the context clearly indicates otherwise.

It will be understood that when a component, such as a layer, a film, a region, or a plate, is referred to as being "on" another component, the component may be directly on the other component or intervening components may be present.

It will be understood that although the terms "first" and "second" may be used herein to describe various components, these components should not be limited by these terms.

The present invention will be described with reference to perspective views, cross-sectional views, and/or plan views, in which exemplary embodiments of the present invention are shown. Thus, the profile of an exemplary view may be modified according to manufacturing techniques and/or allowances. Thus, the exemplary embodiments of the invention are not intended to limit the scope of the present invention but cover all changes and modifications that can be caused due to a change in manufacturing process. Thus, regions shown in the drawings may be illustrated in schematic form and the shapes of the regions may be presented by way of illustration and not as a limitation.

The sizes and thicknesses of elements illustrated in the accompanying drawings are examples and thus should not be construed as limiting the scope of the present invention.

Figure 2:
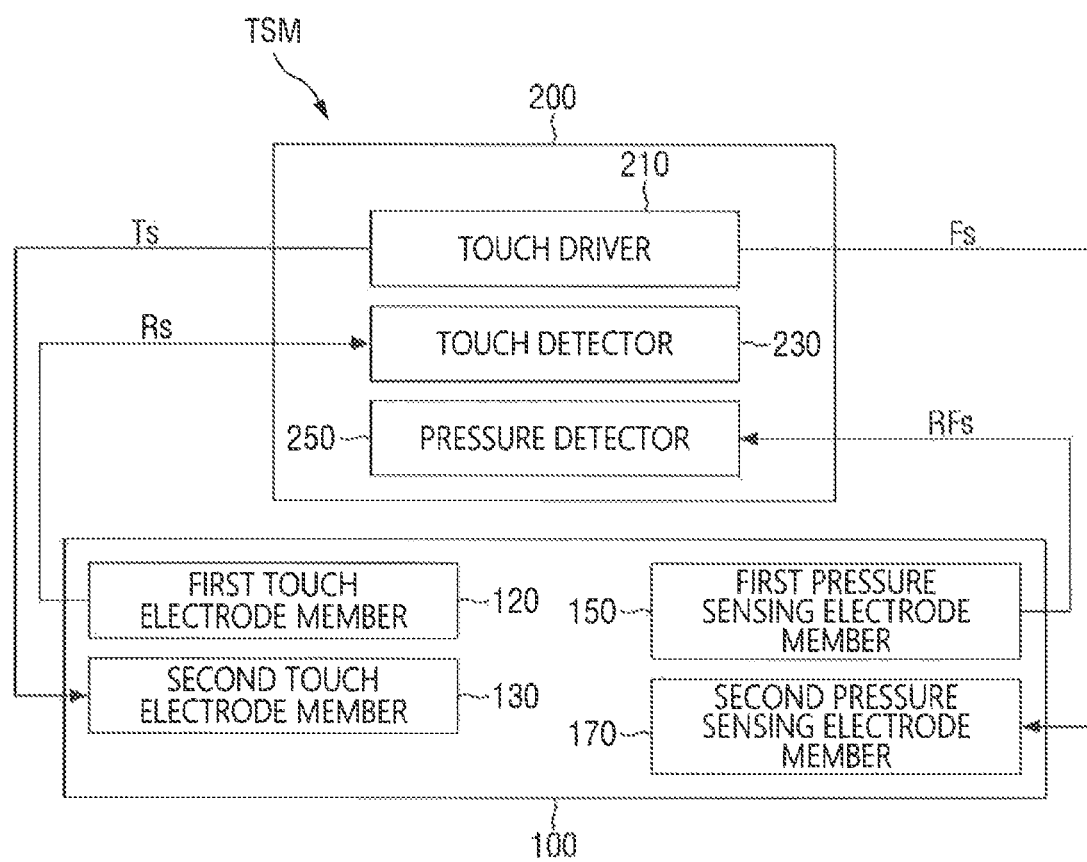
FIG. 2 is a block diagram of a touch sensor according to an exemplary embodiment of the present invention.
Figure 3:
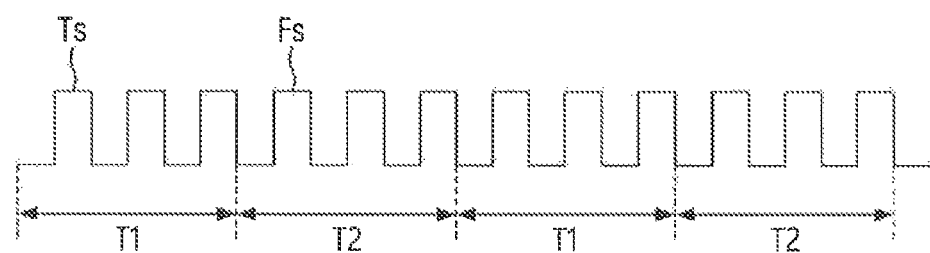
FIG. 3 is a timing diagram for a driving method of the touch sensor of FIG. 2.

FIG. 1 is a schematic view of a display device according to an exemplary embodiment of the present invention. FIG. 2 is a block diagram of a touch sensor according to an exemplary embodiment of the present invention. FIG. 3 is a timing diagram for a driving method of the touch sensor of FIG. 2.

Referring to FIGS. 1 to 3, a display device 1 may include a touch sensor TSM, a display panel 300, and a display driver 400. The touch sensor TSM may include a sensor unit 100 and a touch controller 200. The sensor unit 100 and the display panel 300 may be separate elements; however exemplary embodiments of the present invention are not limited thereto. For example, the sensor unit 100 and the display panel 300 may be formed in one integral body with each other. As an example, according to an exemplary embodiment of the present invention, the display panel 300 and the sensor unit 100 may be formed as a single integrally formed display device (see, e.g., the description of FIG. 13 below).

The display panel 300 may include a display area DA and a non-display area NDA adjacent to the display area DA. As an example, the non-display region NDA may be arranged at four sides of the display region DA in a plan view; however, exemplary embodiments of the present invention are not limited thereto. For example, the non-display region NDA may be arranged at less than four sides (e.g., three sides) of the display region DA in a plan view.

In the display area DA, a plurality of scan lines 310, a plurality of data lines 320, and a plurality of pixels P connected to the scan lines 310 and the data lines 320 may be provided. In the non-display area NDA, wires providing various driving signals and/or driving power for driving the pixels P may be provided.

The type of the display panel 300 is not particularly limited to a particular type of display panel. For example, the display panel 300 may be an emissive display panel such as an organic light-emitting diode (OLED) display panel, a micro-light-emitting diode (LED) display panel, or a nano-LED display panel. Alternatively, the display panel 300 may be a non-emissive display panel such as a liquid crystal display (LCD) panel, an electrophoretic display (EPD) panel, or an electro-wetting display (EWD) panel. In a case where the display panel 300 is a non-emissive display panel, the display device 1 may further include a backlight unit supplying light to the display panel 300. As an example, the display panel 300 may be described as an OLED display panel below; however, exemplary embodiments of the present invention are not limited thereto.

The display driver 400 may be electrically connected to the display panel 300 and may provide signals driving the display panel 300. For example, the display driver 400 may include at least one of a scan driver providing scan signals to the scan lines 310, a data driver providing data signals to the data lines 320, or a timing controller driving the scan driver and the data driver. The scan driver, the data driver, and/or the timing controller may be integrated into a single display integrated circuit (IC) "D-IC", but exemplary embodiments of the present invention are not limited thereto. For example, at least one of the scan driver, the data driver, or the timing controller may be integrated or mounted on the display panel 300.

The sensor unit 100 may be provided in at least part of the display panel 300. For example, the sensor unit 100 may be provided on at least one surface of the display panel 300 to overlap with the display panel 300 (e.g., along a direction orthogonal to an upper surface of the display panel 300). For example, the sensor unit 100 may be disposed on a surface (e.g., the top surface) of the display panel 300 where images are displayed. Alternatively, the sensor unit 100 may be formed directly on at least one surface of the display panel 300 or may be formed in the display panel 300. For example, the sensor unit 100 may be formed directly on an outer surface of an upper or lower substrate of the display panel 300 (e.g., the top surface of the upper substrate or the bottom surface of the lower substrate) or on an inner surface of the upper or lower substrate of the display panel 300 (e.g., the bottom surface of the upper substrate or the top surface of the lower substrate).

The sensor unit 100 may include a sensing area SA sensing a touch input and a non-sensing area NSA adjacent to the sensing area SA. As an example, the non-sensing area NSA may be arranged at four sides of the sensing area SA in a plan view; however, exemplary embodiments of the present invention are not limited thereto. For example, the non-sensing area NSA may be arranged at less than four sides (e.g., three sides) of the sensing area SA in a plan view.

The sensing area SA may be in a position corresponding with that of the display area DA of the display panel 300, and the non-sensing area NSA may be in a position corresponding with that of the non-display area NDA of the display panel 300. For example, the sensing area SA of the sensor unit 100 may overlap with the display area DA of the display panel 300, and the non-sensing area NSA of the sensor unit 100 may overlap with the non-display area NDA of the display panel 300 (e.g., along a direction orthogonal to an upper surface of the display panel 300).

In the sensing area SA of the sensor unit 100, a plurality of first touch electrode members 120 detecting a touch input and a plurality of second touch electrode members 130 detecting a touch input may be provided.

The first touch electrode members 120 may extend in a first direction X and may be spaced apart from one another in a second direction Y, which intersects the first direction X.

As an example, the first direction X may be perpendicular to the second direction Y. The first direction X and the second direction Y may define a plan along which the display device 1 and/or the display driver 400 extend. A third direction may be perpendicular to the first and second directions X and Y. Thus, the third direction may be orthogonal to a plane extending in the first and second directions X and Y.

The second touch electrode members 130 may extend in the second direction Y to cross the first touch electrode members 120, may be insulated from the first touch electrode members 120, and may be spaced apart from one another in the first direction X.

In an exemplary embodiment of the present invention, the first touch electrode members 120 may be insulated from the first touch electrode members 130 by at least one insulating film or insulating layer.

The shape, the size, and/or the arrangement direction of the first touch electrode members 120 and the shape, the size, and/or the arrangement direction of the second touch electrode members 130 are not particularly limited. In a non-limiting example, the first touch electrode members 120 and the second touch electrode members 130 may be arranged in a plurality of rows and columns (see, e.g., FIG. 4) extending along the X and Y directions.

The first touch electrode members 120 and the second touch electrode members 130 may each be electrically connected to the touch controller 200. In an exemplary embodiment of the present invention, the second touch electrode members 130 may be driving electrode members receiving a first driving signal Ts for detecting a touch input from the touch controller 200, and the first touch electrode members 120 may be sensing electrode members outputting a first sensing signal Rs for detecting a touch input to the touch controller 200.

The first touch electrode members 120 and the second touch electrode members 130 may overlap with one or more electrodes provided in the display panel 300 (e.g., along a direction orthogonal to an upper surface of the display panel 300). For example, in a case where the display panel 300 is an OLED display panel or an LCD panel, the first touch electrode members 120 and the second touch electrode members 130 may overlap with cathode electrodes provided in the display panel 300 (e.g., along a direction orthogonal to an upper surface of the display panel 300).

In the sensing area SA of the sensor unit 100, a plurality of first pressure sensing electrode members 150 detecting touch pressure and a plurality of second pressure sensing electrode members 170 detecting touch pressure may be provided. The first pressure sensing electrode members 150 and the second pressure sensing electrode members 170 may be spaced apart from the first touch electrode members 120 and the second touch electrode members 130. For example, the first pressure sensing electrode members 150 and the second pressure sensing electrode members 170 may be insulated from the first touch electrode members 120 and the second touch electrode members 130.

In an exemplary embodiment of the present invention, the first pressure sensing electrode members 150 may extend in the first direction X and may be spaced apart from one another in the second direction Y, which intersects the first direction X.

In an exemplary embodiment of the present invention, the second pressure sensing electrode members 170 may extend in the second direction Y, may be insulated from the first pressure sensing electrode members 150, and may be spaced apart from one another in the first direction X.

The first pressure sensing electrode members 150 and the second pressure sensing electrode members 170 may each be electrically connected to the touch controller 200. In an exemplary embodiment of the present invention, the second pressure sensing electrode members 170 may be driving electrode members receiving a second driving signal Fs for detecting touch pressure from the touch controller 200, and the first pressure sensing electrode members 150 may be sensing electrode members outputting a second sensing signal RFs for detecting touch pressure to the touch controller 200.

The touch controller 200 may be electrically connected to the sensor unit 100 and may detect a touch input and touch pressure by providing the first and second driving signals Ts and Fs to the sensor unit 100 and receiving the first and second sensing signals Ts and Fs, which correspond to the first and second driving signals Ts and Fs, respectively.

In an exemplary embodiment of the present invention, the touch controller 200 may include a touch driver 210, a touch detector 230, and a pressure detector 250.

The touch driver 210 may provide the first driving signal Ts for detecting a touch input to the second touch electrode members 130 and may provide the second driving signal Fs for detecting touch pressure to the second pressure sensing electrode members 170.

The touch detector 230 may receive the first sensing signal Rs corresponding to the first driving signal Ts from the first touch electrode members 120 and may detect the presence and/or the location of a touch input. In an exemplary embodiment of the present invention, the first sensing signal Rs may be information regarding a variation in mutual capacitance generated between the first touch electrode members 120 and the second touch electrode members 130. For example, when a touch input is generated, static capacitance may change at or near the location of the touch input. The touch detector 230 may receive information regarding a variation in the mutual capacitance between the first touch electrode members 120 and the second touch electrode members 130 as the first sensing signal Rs and may determine the presence and/or the location of the touch input using the first sensing signal Rs.

In an exemplary embodiment of the present invention, the touch detector 230 may include one or more amplifiers amplifying the first sensing signal Rs, one or more analog-to-digital converters (ADCs) connected to the output terminals of the amplifiers, and a processor. The structure of the touch detector 230 will be described in more detail below with reference to FIG. 4.

The pressure detector 250 may receive the second sensing signal RFs corresponding to the second driving signal Fs from the first pressure sensing electrode members 150 and may detect touch pressure. In an exemplary embodiment of the present invention, the second sensing signal RFs may include information regarding a variation in mutual capacitance between the first pressure sensing electrode members 150 and the second pressure sensing electrode members 170 or information regarding the self-capacitance of the first pressure sensing electrode members 150.

The pressure detector 250 may store a reference value. For example, the reference value may be a predetermined value stored in the pressure detector 250. For example, if the second sensing signal RFs includes information regarding a variation in the mutual capacitance between the first pressure sensing electrode members 150 and the second pressure sensing electrode members 170, the reference value may be the sum of mutual capacitance variations that can be acquired when a touch input with maximum pressure is generated.

As touch pressure increases, the number of first pressure sensing electrode members 150 where mutual capacitance variations occur may increase because the higher the pressure of a touch input is, the larger the area of the touch input becomes. Thus, the pressure detector 250 may store, as the reference value, the sum of mutual capacitance variations that can be acquired from each of first pressure sensing electrode members 150 corresponding to the area of a touch input generated with maximum pressure. The pressure detector 250 may determine the intensity of touch pressure by comparing the sum of mutual capacitance variations detected from one or more of the first pressure sensing electrode members 150 with the reference value and calculating the ratio between the reference value and the sum of the detected mutual capacitance variations.

Alternatively, in a case where the second sensing signal RFs includes the self capacitance of the first pressure sensing electrode members 150, the pressure detector 250 may store, as the reference value, the sum of self-capacitances that can be acquired when a touch input with maximum pressure is generated. In this case, the pressure detector 250 may determine the intensity of touch pressure by comparing the sum of self-capacitances detected from one or more of the first pressure sensing electrode members 150 with the reference value and calculating the ratio between the reference value and the sum of the detected self-capacitances.

The touch driver 210, the touch detector 230, and the pressure detector 250 may be integrated into a single touch IC "T-IC".

In an exemplary embodiment of the present invention, the touch controller 200 may be driven in a time-division manner. For example, during a first period T1 (which may be interchangeably referred to as a first time period T1), the touch driver 210 may provide the first driving signal Ts to the second touch electrode members 130, and the touch detector 230 may receive the first sensing signal Rs from the first touch electrode members 120. For example, during a second period T2 (which may be interchangeably referred to as a second time period T2), the touch driver 210 may provide the second driving signal Fs to the second pressure sensing electrode members 170 and may receive the second sensing signal RFs from the first pressure sensing electrode members 150.

The first and second periods T1 and T2 may differ from each other and may at least partially overlap with each other. Thus, the second time period T2 might not entirely overlap with the first time period T1. The second period T2 may be completely separate from the first period T1 or may at least partially overlap with the first period T1.

Since the touch controller 200 is driven in a time-division manner, the interference of as signals between the touch electrode members (e.g., 120 and 130) and the pressure sensing electrode members (e.g., 150 and 170) can be prevented, and the driving efficiency of the display device 1 can be increased.

The touch sensor TSM will be described in more detail below with reference to FIGS. 4 through 12.

Figure 4:
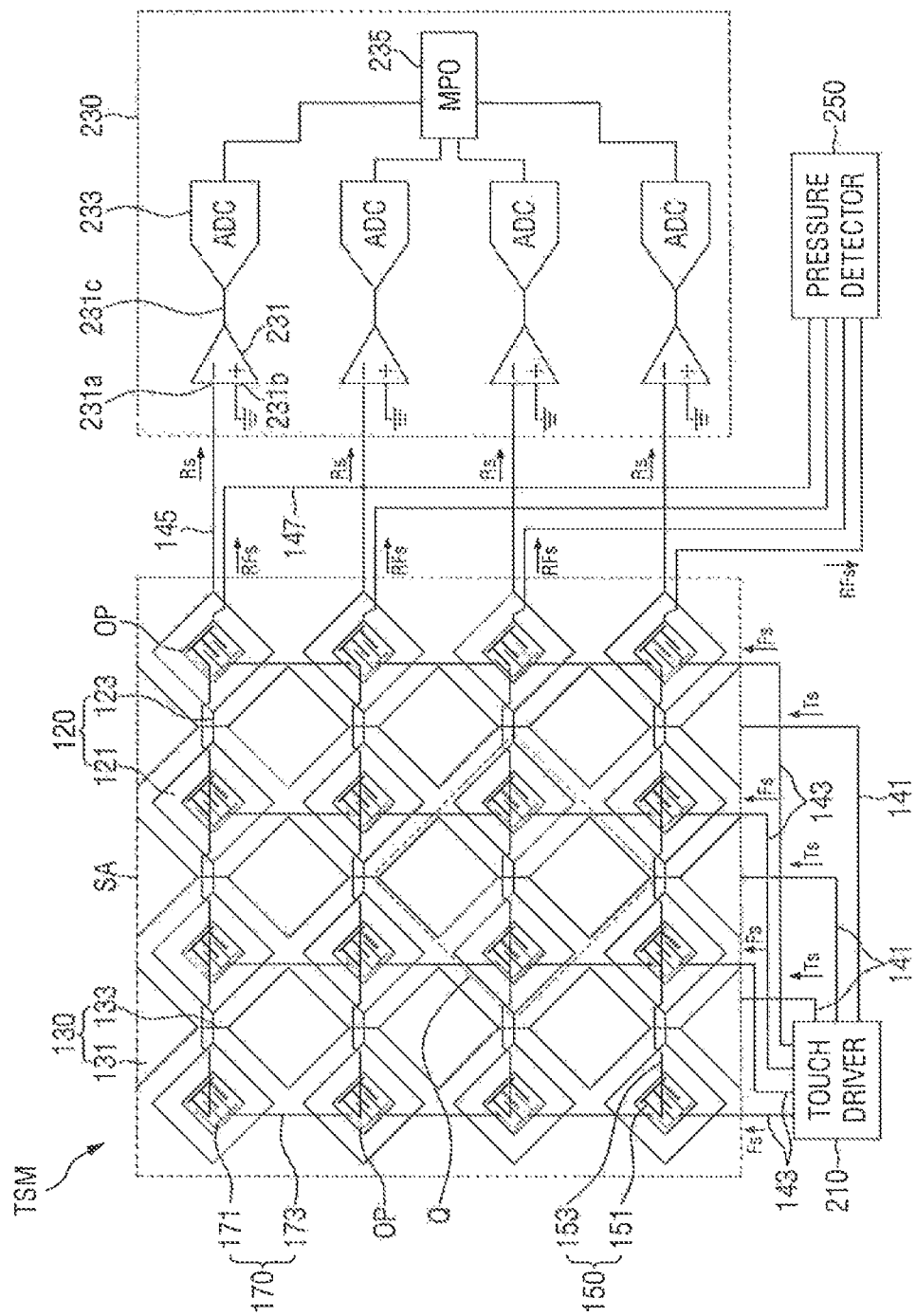
FIG. 4 is a schematic view of the touch sensor of FIG. 2.
Figure 5:
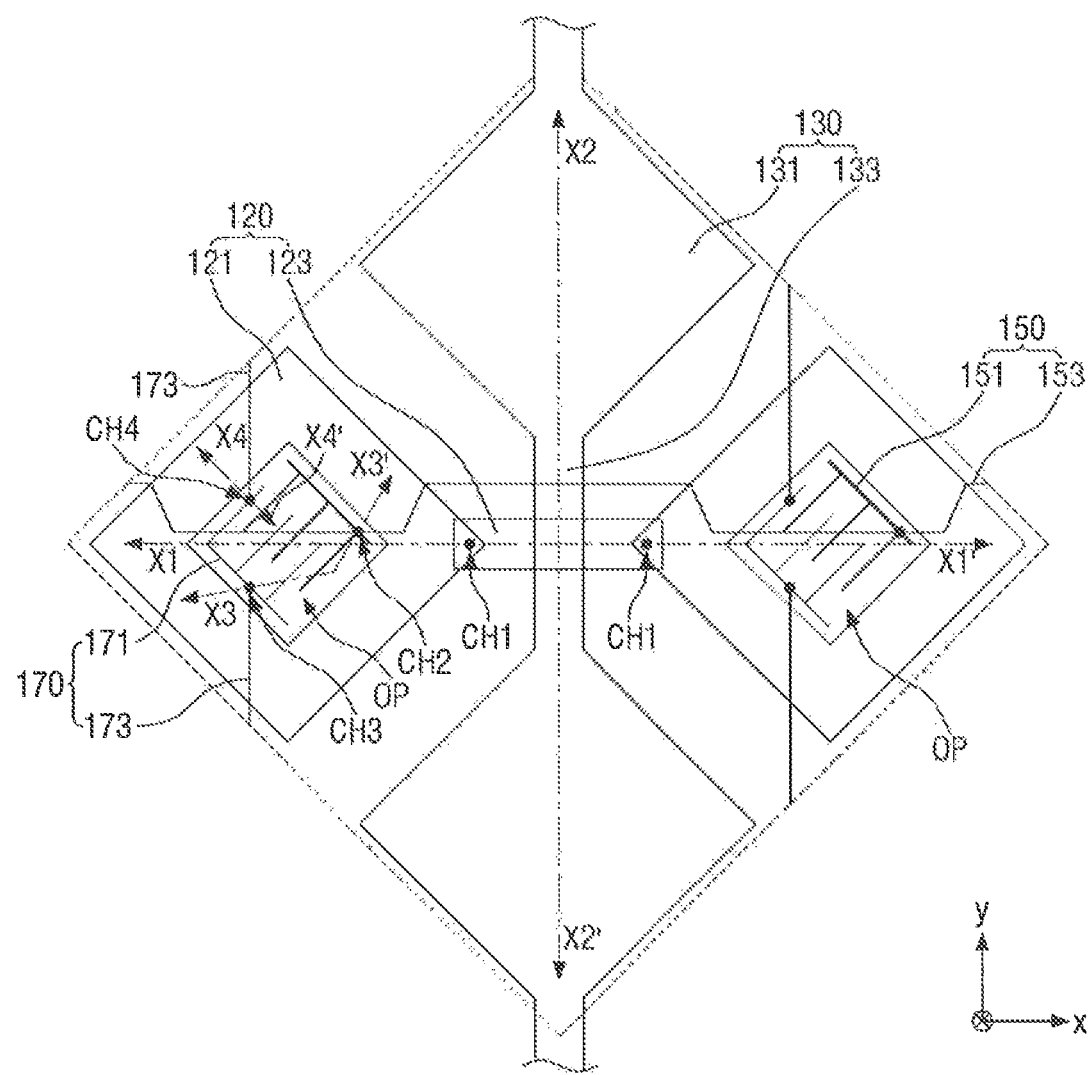
FIG. 5 is an enlarged plan view of a portion Q of FIG. 4.
Figure 6:
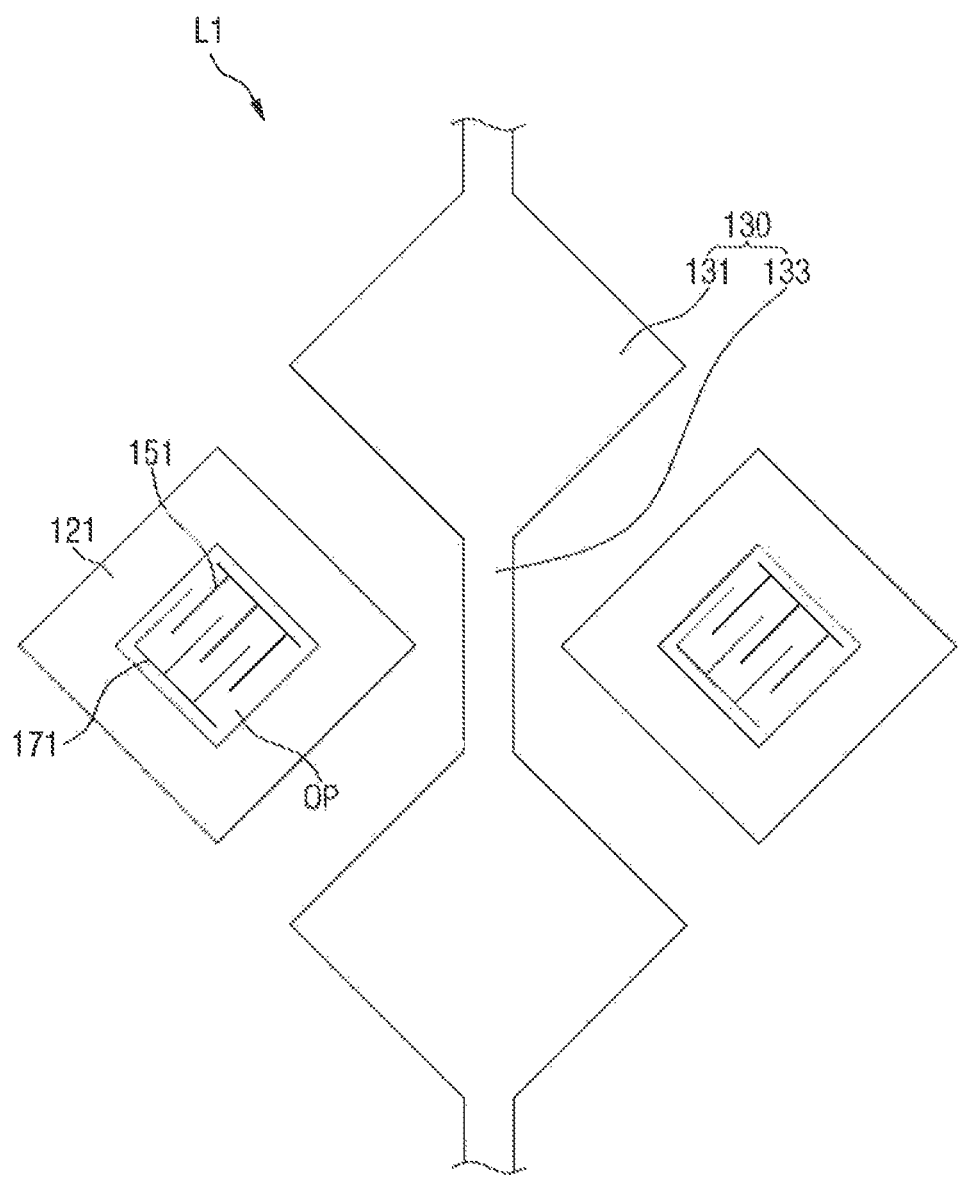
FIG. 6 is an enlarged plan view of a first layer of the sensor unit of FIG. 5.
Figure 7:
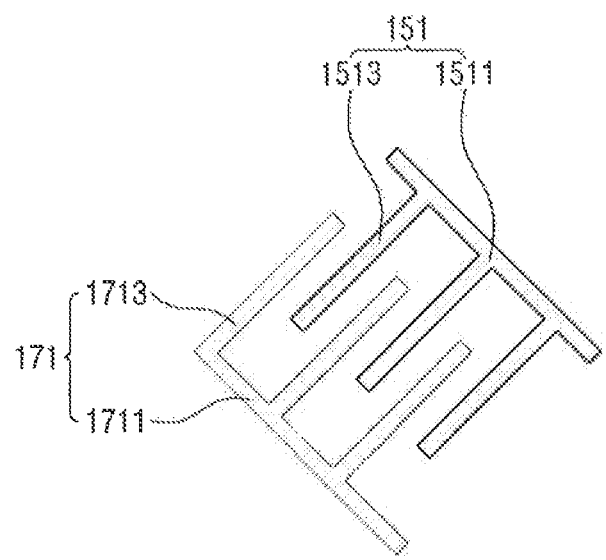
FIG. 7 is an enlarged plan view of first and second pressure sensing electrodes of FIG. 6.
Figure 8:
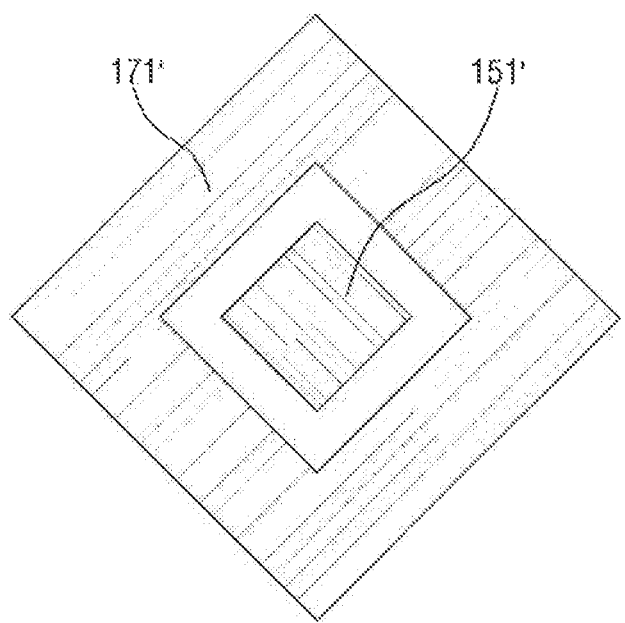
FIG. 8 is an enlarged plan view of the first and second pressure sensing electrodes of FIG. 7.
Figure 9:
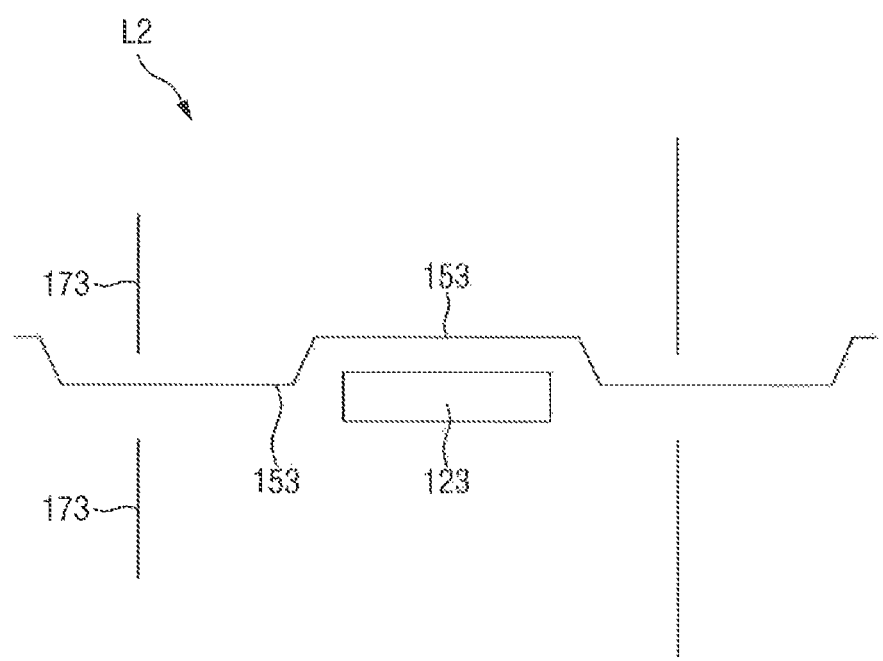
FIG. 9 is an enlarged plan view of a second layer of the sensor unit of FIG. 5.
Figure 10:
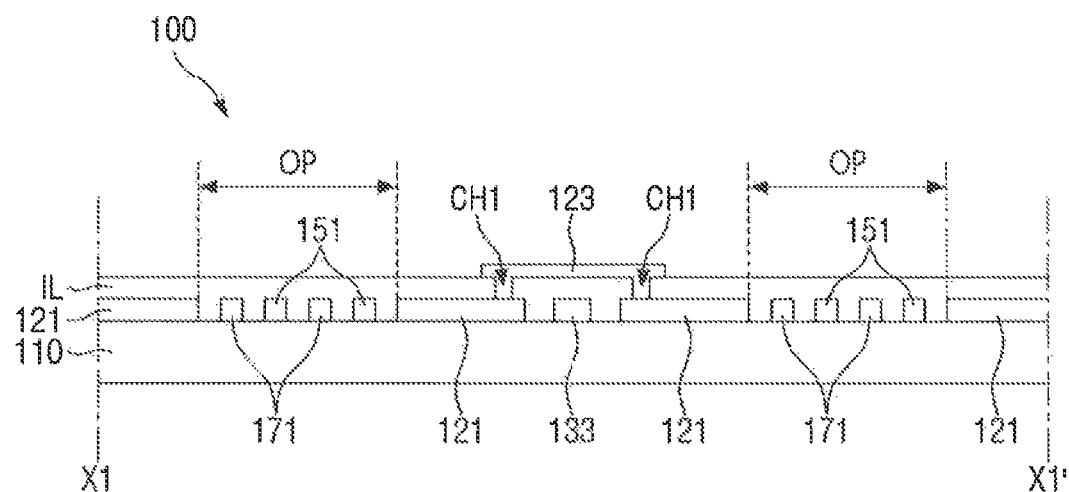
FIG. 10 is a cross-sectional view taken along line X1-X1' of FIG. 5.
Figure 11:
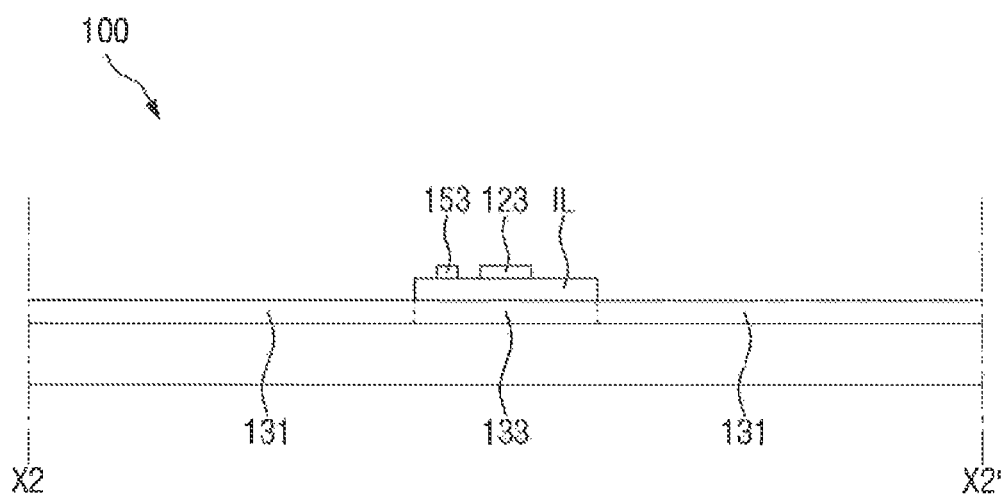
FIG. 11 is a cross-sectional view taken along line X2-X2' of FIG. 5.
Figure 12:
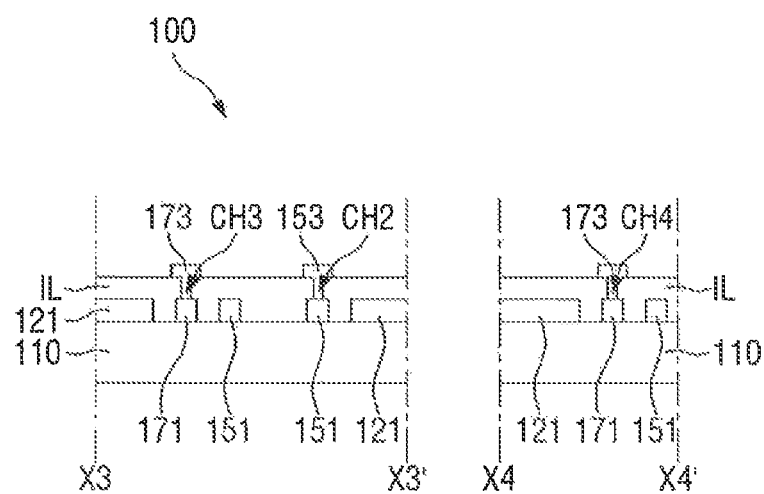
FIG. 12 is a cross-sectional view taken along lines X3-X3' and X4-X4' of FIG. 5.

FIG. 4 is a schematic view of the touch sensor of FIG. 2. FIG. 5 is an enlarged plan view of a portion Q of FIG. 4. FIG. 6 is an enlarged plan view of a first layer of the sensor unit of FIG. 5. FIG. 7 is an enlarged plan view of first and second pressure sensing electrodes of FIG. 6. FIG. 8 is an enlarged plan view of the first and second pressure sensing electrodes of FIG. 7. FIG. 9 is an enlarged plan view of a second layer of the sensor unit of FIG. 5. FIG. 10 is a cross-sectional view taken along line X1-X1' of FIG. 5. FIG. 11 is a cross-sectional view taken along line X2-X2' of FIG. 5. FIG. 12 is a cross-sectional view taken along lines X3-X3' and X4-X4' of FIG. 5.

Referring to FIGS. 4 through 12, the sensor unit 100 may include a base layer 110, the first touch electrode members 120, the second touch electrode members 130, the first pressure sensing electrode members 150, and the second pressure sensing electrode members 170.

The sensing area SA and the non-sensing area NSA may be defined above the base layer 110. Thus, the base layer 110 may include the sensing area SA and the non-sensing area NSA. The base layer 110, which may be the base of the sensor unit 100, may be a rigid substrate or a flexible substrate. For example, the base layer 110 may be a rigid substrate including glass or tempered glass or may be a flexible substrate formed as a thin film including a flexible plastic material. Alternatively, the base layer 110 may be formed as a layer of the display panel 300. For example, in an exemplary embodiment of the present invention where the sensor unit 100 and the display panel 300 are formed in one integral body with each other, the base layer 110 may be at least one substrate (e.g., the upper substrate) or thin-film encapsulation (TFE) layer that forms the display panel 300.

In the sensing area SA, the first touch electrode members 120, the second touch electrode members 130, the first pressure sensing electrode members 150, and the second pressure sensing electrode members 170 may be disposed. The first touch electrode members 120, the second touch electrode members 130, the first pressure sensing electrode members 150, and the second pressure sensing electrode members 170 may be disposed at a same distance above the base layer 110 from each other. Thus, the first touch electrode members 120, the second touch electrode members 130, the first pressure sensing electrode members 150, and the second pressure sensing electrode members 170 may be disposed in a same layer as each other with upper and lower levels thereof aligned with each other along the X and Y directions.

The first touch electrode members 120 may extend in the first direction X and may be spaced apart from one another in the second direction Y.

Each of the first touch electrode members 120 may include a plurality of first touch electrodes 121 arranged in the first direction X and first connectors 123 electrically connecting adjacent first touch electrodes 121 in the first direction X.

In an exemplary embodiment of the present invention, the first touch electrodes 121 may be in direct contact with a first surface of the base layer 110 and may be disposed in a first layer L1. The first touch electrodes 121 may be rhombus-shaped, but exemplary embodiments of the present invention are not limited thereto. For example, the first touch electrodes 121 may be in various other shapes such as a triangular, rectangular, pentagonal, circular, or bar shape.

The first touch electrodes 121 may include a transparent conductive material. Thus, the first touch electrodes 121 may be substantially transparent. For example, the first touch electrodes 121 may include at least one transparent conductive material such as indium tin oxide (ITO), indium zinc oxide (IZO), aluminum-doped zinc oxide (AZO), indium tin zinc oxide (ITZO), zinc oxide (ZnO), tin oxide ($SnO_2$), carbon nanotubes, or graphene.

The first touch electrodes 121 may include openings OP. For example, the first touch electrodes 121 may be open at the centers thereof (e.g., when viewed in a plan view) and may thus expose the first surface of the base layer 110.

The first connectors 123 may electrically connect adjacent first touch electrodes 121 in the first direction X and may be in direct contact with the first touch electrodes 121. In an exemplary embodiment of the present invention, the first connectors 123 may be formed as bridge-type connecting patterns. For example, in an exemplary embodiment of the present invention, the first connectors 123 might not necessarily be in direct contact with the base layer 110, and may be disposed in a second layer L2, which is different from the first layer L1 where the first touch electrodes 121 are disposed. The second layer L2 may be spaced apart from the first layer L1. For example, the first layer L2 may be positioned further away from the base layer 110 than the first layer L1.

In an exemplary embodiment of the present invention, an insulating layer IL may be disposed between the first touch electrodes 121 and the first connectors 123, and the first connectors 123 may be in direct contact with the first touch electrodes 121 via first contact holes CH1, which are formed in the insulating layer IL.

The first connectors 123 may include a conductive material. For example, the first connectors 123 may include gold (Au), silver (Ag), aluminum (Al), molybdenum (Mo), chromium (Cr), titanium (Ti), nickel (Ni), neodymium (Nd), copper (Cu), platinum (Pt), or an alloy thereof. In an exemplary embodiment of the present invention, the first connectors 123 may include a same material as the first touch electrodes 121.

The second touch electrode members 130 may extend in the second direction Y and may be spaced apart from one another in the first direction X.

Each of the second touch electrode members 130 may include a plurality of second touch electrodes 131 arranged in the second direction Y and second connectors 133 electrically connecting adjacent second touch electrodes 131 in the second direction Y.

In an exemplary embodiment of the present invention, the second touch electrodes 131 may be in direct contact with the first surface of the base layer 110 and may be disposed in a same layer as the first touch electrodes 121 (e.g., in the first layer L1). The second touch electrodes 131 may be rhombus-shaped, but exemplary embodiments of the present invention are not limited thereto. For example, the second touch electrodes 131 may be in various other shapes such as a triangular, rectangular, pentagonal, circular, or bar shape.

The second connectors 133 may electrically connect adjacent second touch electrodes 131 in the second direction Y and may be in direct contact with the second touch electrodes 131. In an exemplary embodiment of the present invention, the second connectors 133 may be in direct contact with the base layer 110 and may be disposed in a same layer as the first touch electrodes 121 (e.g., in the first layer L1).

The second connectors 133 may be insulated from the first connectors 123 and may intersect the first connectors 123. In an exemplary embodiment of the present invention, the insulating layer IL may also be disposed between the second connectors 133 and the first connectors 123.

The second touch electrodes 131 and the second connectors 133 may each include a transparent conductive material. Thus, the second touch electrodes 131 and the second connectors 133 may be substantially transparent. In an exemplary embodiment of the present invention, the second touch electrodes 131 and the second connectors 133 may include a same material as the first touch electrodes 121.

In an exemplary embodiment of the present invention, the second touch electrodes 121 may be driving electrodes receiving the first driving signal Ts to detect a touch location, and the first touch electrodes 121 may be sensing electrodes outputting the first sensing signal Rs to detect a touch location.

Each of the first pressure sensing electrode members 150 may include a plurality of first pressure sensing electrodes 151 and a first connecting line 153.

The first pressure sensing electrodes 151 may be disposed in the openings OP of the first touch electrodes 121 and may be spaced apart from the first touch electrodes 121. In an exemplary embodiment of the present invention, the first pressure sensing electrodes 151 may be in direct contact with the first surface of the base layer 110 and may be disposed in a same layer as the first touch electrodes 121 (e.g., in the first layer L1). In an exemplary embodiment of the present invention, the first pressure sensing electrodes 151 may be disposed in each of the openings OP of the first touch electrodes 121

The first pressure sensing electrodes 151 may include a conductive material. In an exemplary embodiment of the present invention, the first pressure sensing electrodes 151 may include a transparent conductive material and may include a same material as the first touch electrodes 121. Thus, the first pressure sensing electrodes 151 may be substantially transparent.

The first connecting line 153 may electrically connect adjacent first pressure sensing electrodes 151 in the first direction X and may be in direct contact with the first pressure sensing electrodes 151. The first connecting line 153 might not be in direct contact with, but may be spaced apart from, the first touch electrode members 120 and the second touch electrode members 130. In an exemplary embodiment of the present invention, the first connecting line 153 may be disposed in a same layer as the first connectors 123 (e.g., in the second layer L2), and may include a same material as the first connectors 123. In a plan view, the first connecting line 153 may be disposed not to overlap with the first connectors 123. For example, the first connecting line 153 may connect adjacent first pressure sensing electrodes 151 without passing through the regions where the first connectors 123 are disposed.

In an exemplary embodiment of the present invention, the insulating layer IL may also be disposed between the first pressure sensing electrodes 151 and the first connecting line 153, and the first connecting line 153 may be in direct contact with the first pressure sensing electrodes 151 through second contact holes CH2, which are formed in the insulating layer IL.

Each of the second pressure sensing electrode members 170 may include a plurality of second pressure sensing electrodes 171 and a second connecting line 173.

The second pressure sensing electrodes 171 may be disposed in the openings OP of the first touch electrodes 121 and may be spaced apart from the first touch electrodes 121 and the first pressure sensing electrodes 151. In an exemplary embodiment of the present invention, the second pressure sensing electrodes 171 may be in direct contact with the first surface of the base layer 110 and may be disposed in a same layer as the first touch electrodes 121 and the first pressure sensing electrodes 151 (e.g., in the first layer L1).

The second pressure sensing electrodes 171 may include a conductive material. In an exemplary embodiment of the present invention, the second pressure sensing electrodes 171 may include a transparent conductive material and may include a same material as the first touch electrodes 121 and the first pressure sensing electrodes 151. Thus, the second pressure sensing electrodes 171 may be substantially transparent.

The second connecting line 173 may electrically connect adjacent second pressure sensing electrodes 171 in the second direction Y and may be in direct contact with the second pressure sensing electrodes 171. The second connecting line 173 might not be in direct contact with, but may be spaced apart from, the first touch electrode members 120, the second touch electrode members 130, and the first pressure sensing electrode members 150. In an exemplary embodiment of the present invention, the second connecting line 173 may be disposed in a same layer as the first connecting line 153 and the first connectors 123 (e.g., in the second layer L2), and may include a same material as the first connecting line 153 and the first connectors 123.

In an exemplary embodiment of the present invention, the insulating layer IL may be disposed between the second pressure sensing electrodes 171 and the second connecting line 173, and the second connecting line 173 may be in direct contact with the second pressure sensing electrodes 171 through third contact holes CH3 and fourth contact holes CH4, which are formed in the insulating layer IL.

In an exemplary embodiment of the present invention, the second pressure sensing electrodes 171 may be driving electrodes receiving the second driving signal Fs to detect touch pressure, and the first pressure sensing electrodes 151 may be sensing electrodes outputting the second sensing signal RFs to detect touch pressure.

The openings OP where the first pressure sensing electrodes 151 and the second pressure sensing electrodes 171 are disposed might not be formed in the second touch electrodes 131, which are driving electrodes, and may be formed in the first touch electrodes 121, which are sensing electrodes. Accordingly, interference between the first and second driving signals Ts and Fs can be prevented.

In an exemplary embodiment of the present invention, the first pressure sensing electrodes 151 and the second pressure sensing electrodes 171 may be comb-shaped electrodes (see, e.g., FIG. 7). The first pressure sensing electrodes 151 and the second pressure sensing electrodes 171 may include branch electrodes that are alternately and repeatedly spaced apart from each other. For example, opposite sides of a branch electrode of the first pressure sensing electrode 151 may be adjacent to first and second branch electrodes, respectively, of the second pressure sensing electrode.

For example, the first pressure sensing electrodes 151 and the second pressure sensing electrodes 171 may each include a stem electrode (or a connecting electrode) and branch electrodes (or finger electrodes). The first pressure sensing electrodes 151 and the second pressure sensing electrodes 171 may be arranged such that the branch electrodes of each of the first pressure sensing electrodes 151 and the branch electrodes of each of the second pressure sensing electrodes 171 can be staggered with respect to each other. Accordingly, the area in which the first pressure sensing electrodes 151 and the second pressure sensing electrodes 171 face each other can be enlarged, and as a result, an effective pressure sensing can be performed. Thus, the branch electrodes of each of the first pressure sensing electrodes 151 and the branch electrodes of each of the second pressure sensing electrodes 171 might not overlap each other in a plan view.

Each of the first pressure sensing electrodes 151 may include a first stem electrode 1511 extending in one direction and a plurality of first branch electrodes 1513 branched off from the first stem electrode 1511. As an example, the first branch electrodes 1513 may each be perpendicular to the first stem electrode 1511.

The first branch electrodes 1513, which are adjacent to one another in the opening OP, may be a predetermined distance apart from one another and may be disposed between a plurality of second branch electrodes 1713 of a second pressure sensing electrode 171. As an example, the number of first branch electrodes 1513 disposed in each opening OP may be 2 to 20.

Each of the second pressure sensing electrodes 171 may include a second stem electrode 1711 extending in one direction and a plurality of second branch electrodes 1713 branched off from the second stem electrode 1711. As an example, the second branch electrodes 1713 may each be perpendicular to the second stem electrode 1711.

The second branch electrodes 1713 may be branched off, and extend, from the second stem electrode 1711. The direction in which the second branch electrodes 1713 extend may be opposite to the direction in which the first branch electrodes 1513 extend. The second branch electrodes 1713 may be disposed between the first branch electrodes 1513. As an example, the number of first branch electrodes 1513 disposed in each opening OP may be the same as the number of second branch electrodes 1713 disposed in each opening OP, but exemplary embodiments of the present invention are not limited thereto.

The first branch electrodes 1513 and the second branch electrodes 1713 may be alternately arranged in the opening OP. The distance between each pair of adjacent branch electrodes (1513 and 1713) in the opening OP may be substantially uniform, but exemplary embodiments of the present invention are not limited thereto.

The structures of the first pressure sensing electrodes 151 and the second pressure sensing electrodes 171 may be modified in various manners. For example, a second pressure sensing electrode 171' may be formed to surround a first pressure sensing electrode 151' (e.g., in a plan view, such as in FIG. 8), and the first pressure sensing electrode 151' may be diamond-shaped. Various modifications other than those set forth herein can be made to the structures of the first pressure sensing electrodes 151 and the second pressure sensing electrodes 171.

The insulating layer IL may be disposed between the first layer L1 and the second layer L2. In an exemplary embodiment of the present invention, the insulating layer IL may be disposed not to overlap with the second touch electrodes 131 (e.g., along a direction orthogonal to an upper surface of the display panel 300). The insulating layer IL may overlap with the first touch electrodes 121, the first pressure sensing electrodes 151, the second pressure sensing electrodes 171, the first connectors 123, and the second connectors 133 (e.g., along a direction orthogonal to an upper surface of the display panel 300), but exemplary embodiments of the present invention are not limited thereto. The location and the shape of the insulating layer IL can be modified in various manners such that the insulating layer IL insulates the first touch electrode members 120, the second touch electrode members 130, the first pressure sensing electrode members 150, and the second pressure sensing electrode members 170 from one another.

In an exemplary embodiment of the present invention, in the non-sensing area NSA of the base layer 110, wires (e.g., wires 141, 143, 145, and/or 147) may be provided. For example, the wires (e.g., 141, 143, 145, and 147) may include first wires 141 electrically connecting the second touch electrode members 130 and the touch driver 210, second wires 143 electrically connecting the second pressure sensing electrode members 170 and the touch driver 210, third wires 145 electrically connecting the first touch electrode members 120 and the touch detector 230, and fourth wires 147 electrically connecting the first pressure sensing electrode members 150 and the pressure detector 250.

The touch driver 210 may provide the first driving signal Ts to the second touch electrode members 130 via the first wires 141 and may provide the second driving signal Fs to the second pressure sensing electrode members 170 via the second wires 143.

The touch detector 230 may receive the first sensing signal Rs from the first touch electrode members 120 via the third wires 145. In an exemplary embodiment of the present invention, the first sensing signal Rs may include information regarding a variation in the mutual capacitance between the first touch electrode members 120 and the second touch electrode members 130.

In an exemplary embodiment of the present invention, the touch detector 230 may include one or more amplifiers 231 such as operational (OP) amplifiers, one or more ADCs 233, and a processor 235.

Each of the amplifiers 231 may include a first input terminal 231a, a second input terminal 231b, and an output terminal 231c. The first input terminals 231a of the amplifiers 231, for example, the inverting input terminals of OP amplifiers, may be electrically connected to the first touch electrode members 120 via the third wires 145, and the first sensing signal Rs may be input to the first input terminals 231a of the amplifiers 231. The second input terminals 231b of the amplifiers 231, for example, the non-inverting input terminals of OP amplifiers, may be reference potential terminals and may be connected to a reference power supply such as a ground power supply. The output terminals 231c of the amplifiers 231 may be electrically connected to the ADCs 233.

The ADCs 233 may convert analog signals input thereto into digital signals. As many ADCs 233 as there are first touch electrode members 120 may be provided such that the ADCs 233 can correspond one-to-one to the first touch electrode members 120. Alternatively, the first touch electrode members 120 may be configured to share, a single ADC 233 together, in which case, a switching circuit for choosing a channel may be provided.

The processor 226 may perform signal processing on the digital signals provided by the ADCs 233 and may detect a touch input based on the results of the signal processing. For example, the processor 226 may analyze the first sensing signal Rs, amplified by the amplifiers 231 and converted by the ADCs 233, and may determine the presence and the location of a touch input based on the results of the analysis. The processor 226 may be implemented as a micro-processing unit (MPU), in which case, a memory for driving the processor 226 may be provided in the touch detector 230. The configuration of the processor 226 is not particularly limited. For example, alternatively, the processor 226 may be implemented as a micro-controller unit (MCU).

The pressure detector 250 may receive the second sensing signal RFs from the first pressure sensing electrode members 150 via the fourth wires 147. The second sensing signal RFs may include information regarding a variation in the mutual capacitance between the first pressure sensing electrode members 150 and the second pressure sensing electrode members 170 or information regarding the self-capacitance of the first pressure sensing electrode members 150.

The pressure detector 250 may determine the intensity of touch pressure by comparing the second sensing signal RFs with a previously-stored reference value.

Since the first touch electrodes 121, the second touch electrodes 131, the first pressure sensing electrodes 151, and the second pressure sensing electrodes 171 may all be disposed in the same layer (e.g., the first layer L1), the first touch electrodes 121, the second touch electrodes 131, the first pressure sensing electrodes 151, and the second pressure sensing electrodes 171 can be formed at substantially the same time, and as a result, the fabrication of the touch sensor TSM can be simplified. Thus, manufacturing costs may be reduced, and manufacturing efficiency may be increased. Also, since the first touch electrodes 121, the second touch electrodes 131, the first pressure sensing electrodes 151, and the second pressure sensing electrodes 171 can all be disposed in the first layer L1, the touch sensor TSM can be provided with a pressure sensing function and can be slimmed down to be relatively thin.

The base layer 110, which may be the base of the sensor unit 100, may be a TFE layer of an OLED display panel. The base layer 110 may be formed as a multilayer film including at least one organic film and at least one inorganic film or as a single-layer film comprising the combination of organic and inorganic materials. For example, the base layer 110 may be formed as a multilayer film including at least two inorganic films and at least one organic film disposed between the at least two inorganic films. In a display device 1 in which the base layer 110 is implemented as a TFE layer of an OLED display panel, the electrodes of the sensor unit 100 and the elements of the display panel 300 may be disposed on different surfaces of the base layer 110.

The arrangement of the electrodes of the sensor unit 100 and the elements of the display panel 300 will be described in more detail below with reference to FIG. 13. Descriptions of components, layers or regions of the sensor unit 100 that are the same or substantially the same as those provided above may be omitted below.

Figure 13:
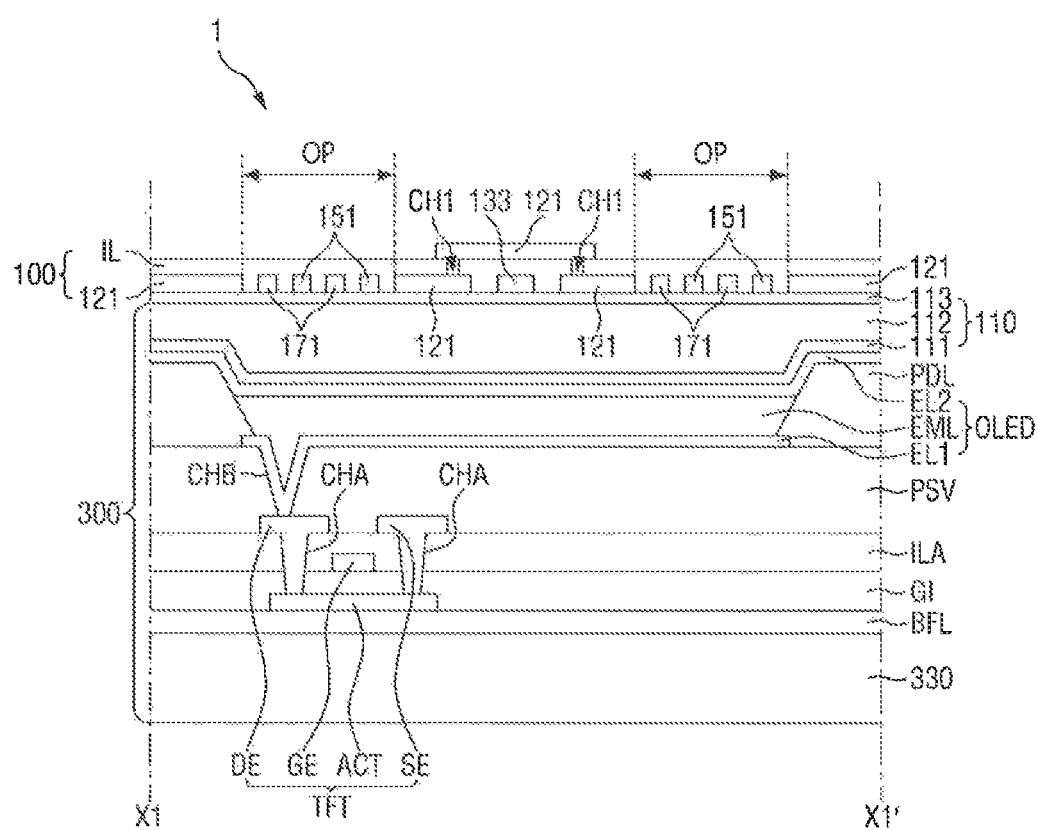
FIG. 13 is a cross-sectional view of a display device including the structure of FIG. 10.

FIG. 13 is a cross-sectional view of a display device including the structure of FIG. 10.

Referring to FIG. 13, the sensor unit 100 may be formed or provided directly on the display panel 300 (e.g., on the TFE layer of an OLED display panel). For example, the display panel 300 and the sensor unit 100 may be formed in one integral body with each other. For example, the base layer 110 of the sensor unit 100 may be the TFE layer of the display panel 300. Thus, the base layer 110 may be interchangeably referred to as a thin film encapsulation (TFE) layer 110 herein. As an example, the display panel 300 may include a light-emitting element (e.g., an OLED) and a TFT connected to the light-emitting element.

The display panel 300 may include a first substrate 330, the OLED provided on a first surface of the first substrate 330, and the TFE layer 110 provided on the OLED. The TFE layer 110 may substantially cover the OLED. The display panel 300 may include at least one thin film transistor (TFT) connected to the OLED. The TFT may be disposed between the first substrate 330 and the OLED.

The display panel 300 may include at least one power line, at least one signal line, and/or at least one capacitor.

The first substrate 330 may be a rigid substrate or a flexible substrate, and a material included in the first substrate 330 is not limited to a particular material. For example, the first substrate 330 may be a thin-film substrate having flexibility.

A buffer layer BFL may be disposed on the first surface of the first substrate 330. For example, the buffer layer BFL may be in direct contact with an upper surface of the first substrate 330 facing the sensor unit 100. The buffer layer BFL can prevent the diffusion of impurities from the first substrate 330 and can increase the flatness of the first substrate 330. The buffer layer BFL may include a single-layer film or as a multilayer film having at least two layers. The buffer layer BFL may include an inorganic insulating layer including an inorganic material. For example, the buffer layer BFL may include silicon nitride, silicon oxide, or silicon oxynitride. In a case where the buffer layer BFL includes a multilayer film, the layers of the multilayer film may include a same material as each other or may include different materials from each other. According to an exemplary embodiment of the present invention, the buffer layer BFL may be omitted.

The TFT may be provided on the buffer layer BFL. The TFT may include an active layer ACT, a gate electrode GE, a source electrode SE, and a drain electrode DE. The active layer ACT may be provided on the buffer layer BFL and may include a semiconductor material. For example, the active layer ACT may be a semiconductor pattern including polysilicon, amorphous silicon, or an oxide semiconductor. For example, a part of the active layer ACT overlapping with the gate electrode GE (e.g., along a direction orthogonal to an upper surface of the first substrate 330) might not be doped with impurities, and the rest of the active layer ACT may be doped with impurities.

A gate insulating film GI may be provided on the active layer ACT, and the gate electrode GE may be provided on the gate insulating film GI. An interlayer insulating film ILA may be provided on the gate electrode GE, and the source electrode SE and the drain electrode DE may be provided on the interlayer insulating film ILA. The source electrode SE and the drain electrode DE may be in direct contact with, and electrically connected to, the active layer ACT via contact holes CHA that penetrate the gate insulating film GI and the interlayer insulating film ILA.

A passivation layer PSV may be provided on the source electrode SE and the drain electrode DE. The passivation layer PSV may substantially cover the TFT.

The OLED may be provided on the passivation layer PSV. The OLED may include a first electrode EL1, a second electrode EL2, and an emission layer EML disposed between the first and second electrodes EL1 and EL2. The first electrode EL1 of the OLED may be an anode, but exemplary embodiments of the present invention are not limited thereto. For example, the first electrode EL1 may be a cathode. The first electrode EL1 of the OLED may be in direct contact with, and may be electrically connected to, an electrode of the TFT (e.g., the drain electrode DE) via a contact hole CHB that penetrates the passivation layer PSV.

A pixel-defining layer PDL, which defines each pixel region (e.g., or the emission region of each pixel) may be provided on the first surface of the first substrate 330 where the first electrode EL1 is disposed. The pixel-defining layer PDL may expose the top surface of the first electrode EL1 and may protrude from the first substrate 330 along the boundaries of each pixel region.

The emission layer EML may be provided in each pixel region and may be surrounded by the pixel-defining layer PDL (e.g., in a plan view). For example, the emission layer EML may be disposed on an exposed part of the surface of the first electrode EL1. The emission layer EML may have a multilayer thin-film structure including at least a light-generating layer. For example, the emission layer EML may include a hole injection layer, a hole transport layer, a light-generating layer, a hole blocking layer, an electron transport layer, or an electron injection layer. The color of light generated by the emission layer EML may be one of red, green, or blue colors, but exemplary embodiments of the present invention are not limited thereto. Alternatively, the color of the light generated by the emission layer EML may be one of magenta, cyan, or yellow colors.

The second electrode EL2 of the OLED may be disposed on the emission layer EML. The second electrode EL2 of the OLED may be a cathode.

The TFE layer 110, which substantially covers the second electrode EL2 of the OLED may be provided on the second electrode EL2 of the OLED. When each pixel region of the display panel 300 is encapsulated by the TFE layer 110, the thickness of the display device 1 can be reduced, and the flexibility of the display device 1 can be increased.

The TFE layer 110 may include a single or multilayer film. For example, the TFE layer 110 may include first and second inorganic films 111 and 113 overlapping with each other (e.g., along a direction orthogonal to an upper surface of the first substrate 330) and an organic film 112 disposed between the first and second inorganic films 111 and 113.

In the display device 1, the display panel 300 may be implemented as an OLED display panel including the TFE layer 110, and the electrodes of the sensor unit 100 may be formed directly on the TFE layer 110. For example, the first touch electrodes 121, the second touch electrodes 131, the second connectors 133, the first pressure sensing electrodes 151, and the second pressure sensing electrodes 171 may be provided directly on the TFE layer 110.

According to an exemplary embodiment of the present invention, a display device may include the display panel 300 including the base substrate 330, the thin film transistor TFT positioned above the base substrate 330 the emission layer EML electrically connected with the thin film transistor TFT, and a thin film encapsulation layer 110 positioned above the emission layer EML. The sensor unit 100 may be disposed directly on the thin film encapsulation layer 110. The sensor unit 100 may include a plurality of first touch electrodes 121 disposed on the thin film encapsulation layer 110. The plurality of first touch electrodes 121 may be arranged in a first direction (e.g., the X direction). The plurality of first touch electrodes 121 may include openings OP. The plurality of first touch electrodes 121 may be electrically connected to one another. A plurality of second touch electrodes 131 may be disposed on the thin film encapsulation layer 110. The plurality of second touch electrodes 131 may be arranged in a second direction (e.g., the Y direction), which intersects the first direction. The plurality of second touch electrodes 131 may be electrically connected to one another. First pressure sensing electrodes 151 and second pressure sensing electrodes 171 may be separated from each other and may be disposed in the openings OP of the first touch electrodes 121 in a plan view (e.g., along a direction orthogonal to the first and second directions X and Y). The first pressure sensing electrodes 151 and second pressure sensing electrodes 171 may be spaced apart from the first touch electrodes 121. The first pressure sensing electrodes 151, the second pressure sensing electrodes 171, the first touch electrodes 121, and the second touch electrodes 131 may each be in direct contact with the thin film encapsulation layer 110. Thus, according to an exemplary embodiment of the present invention, the display panel 300 and the sensor unit 100 may be formed as a single integrally formed display device.

Figure 14:
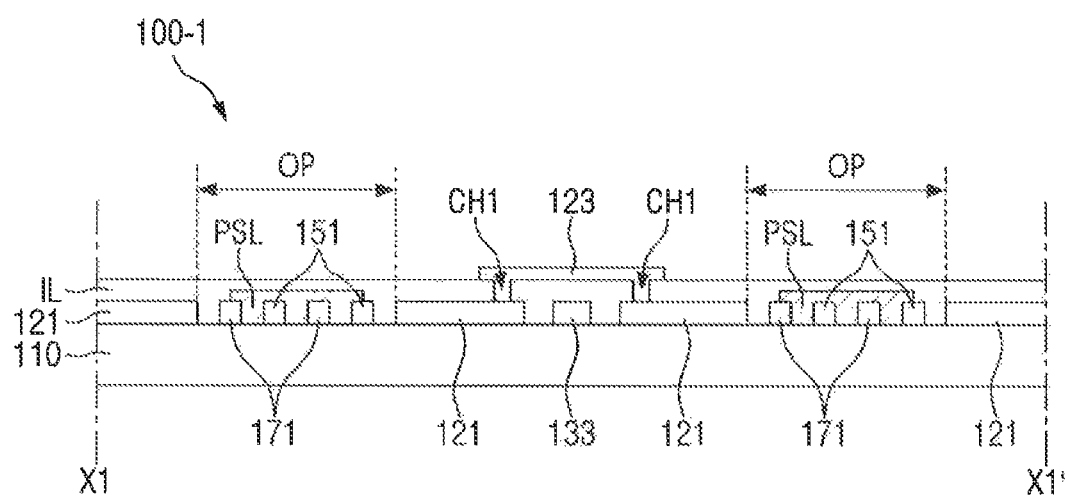
FIG. 14 is a cross-sectional view, taken along line X1-X1' of FIG. 5, according to an exemplary embodiment of the present invention.
Figure 15:
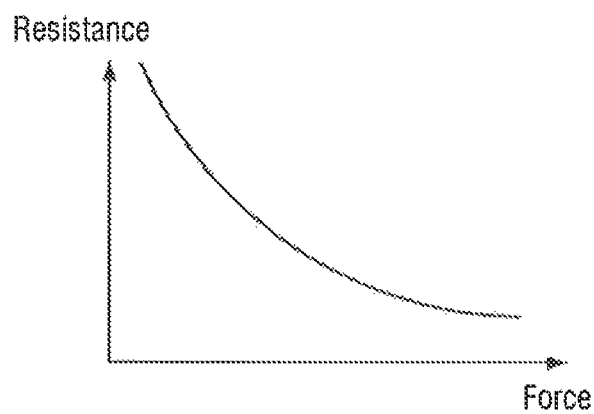
FIG. 15 is a graph showing the resistance of a pressure sensing layer against pressure.

FIG. 14 is a cross-sectional view, taken along line X1-X1' of FIG. 5 according to an exemplary embodiment of the present invention. FIG. 15 is a graph showing the resistance of a pressure sensing layer against pressure.

Referring to FIG. 14, a sensor unit 100-1 is substantially the same as the sensor unit 100 except that it further includes a pressure sensing layer PSL. The cross-sectional structure of the sensor unit 100-1 along line X2-X2' of FIG. 5 may be substantially the same as the structure described with reference to FIG. 11, and the cross-sectional structure of the sensor unit 100-1 along line X3-X3' of FIG. 5 may be substantially the same as the structure described with reference to FIG. 12. Thus, the sensor unit 100-1 will be described in more detail below focusing on the differences with the sensor unit 100.

The pressure sensing layer PSL may be disposed in openings OP of first touch electrodes 121. The pressure sensing layer PSL may be disposed on first pressure sensing electrodes 151 and second pressure sensing electrodes 171 and may partially cover the first pressure sensing electrodes 151 and the second pressure sensing electrodes 171. The pressure sensing layer PSL may be in direct contact with upper and side surfaces of the first pressure sensing electrodes 151 and the second pressure sensing electrodes 171. The pressure sensing layer PSL may be disposed in the openings OP and may be spaced apart from the first touch electrodes 121. In an exemplary embodiment of the present invention, the pressure sensing layer PSL may be disposed below an insulating layer IL. An upper surface and side surfaces of the pressure sensing layer PSL may be substantially covered by the insulating layer IL.

The pressure sensing layer PSL may include a pressure sensitive material. The pressure sensitive material may include nanoparticles including a metal such as Al, tin (Sn), or Cu, or carbon (C). The pressure sensitive material may be disposed in a polymer resin in the form of particles, but exemplary embodiments of the present invention are not limited thereto. Referring to FIG. 15, as the pressure applied to the pressure sensing layer PSL increases, the resistance of the pressure sensing layer decreases, and by using this characteristic of the pressure sensing layer PSL, the presence and the intensity of pressure can be detected.

The first pressure sensing electrodes 151 and the second pressure sensing, electrodes 171 may be electrically connected via the pressure sensing layer PSL. The pressure sensing layer PSL may serve as a resistor between the first pressure sensing electrodes 151 and the second pressure sensing electrodes 171.

When there is no pressure, or only a relatively small pressure, applied to the pressure sensing layer PSL, the pressure sensing layer PSL has a high resistance. In this case, even if the second driving signal Fs is applied to the second pressure sensing electrodes 171, a current might not flow at all to the first pressure sensing electrodes 151. On the other hand, as the pressure applied to the pressure sensing layer PSL increases, the resistance of the pressure sensing layer PSL decreases, and the amount of current flowing between the first pressure sensing electrodes 151 and the second pressure sensing electrodes 171 increases.

Accordingly, when a driving voltage is applied to the second pressure sensing electrodes 171 as the second driving signal Fs, the pressure detector 230 may detect the amount of current generated in the first pressure sensing electrodes 151 as the second sensing signal RFs and may convert the sensed amount of current into voltage data. Then, the level of pressure applied to the pressure sensing layer PSL can be identified based on the voltage data.

Figure 16:
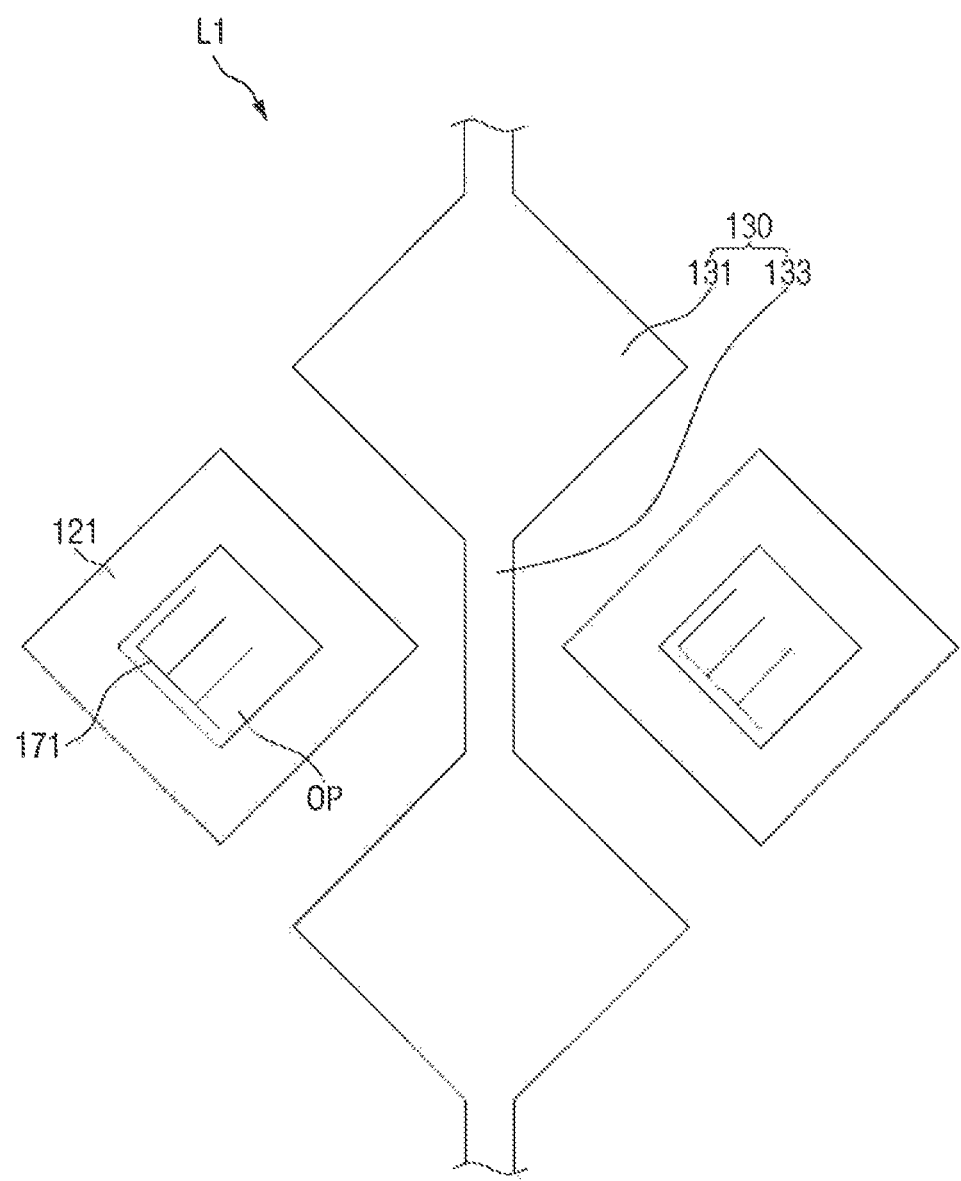
FIG. 16 is an enlarged plan view of a first layer of a sensor unit of the touch sensor of FIG. 2.
Figure 17:
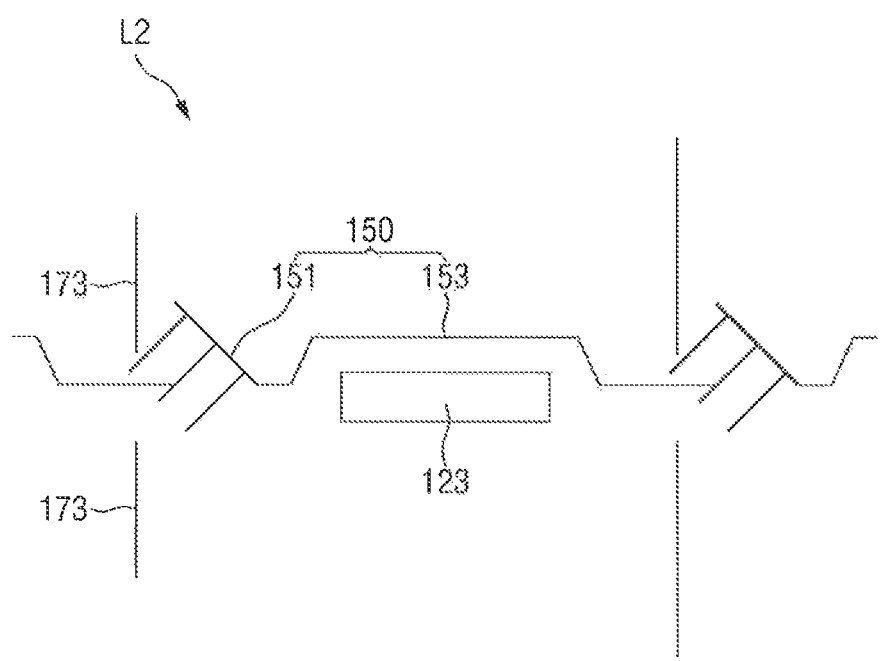
FIG. 17 is an enlarged plan view of a second layer of the sensor unit of FIG. 16.
Figure 18:
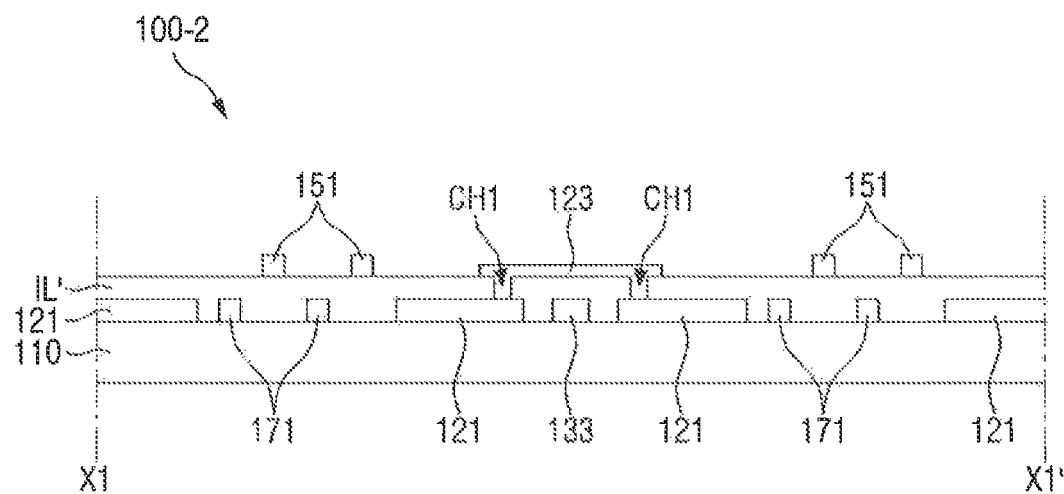
FIG. 18 is a cross-sectional view, taken along line X1-X1' of FIG. 5, of the sensor unit of FIG. 16.
Figure 19:
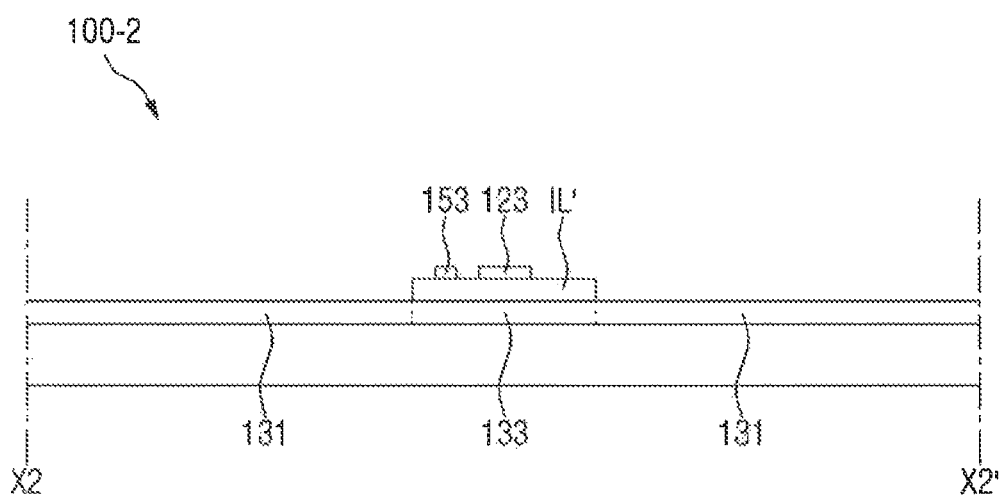
FIG. 19 is a cross-sectional view, taken along line X2-X2' of FIG. 5, of the sensor unit of FIG. 16.
Figure 20:
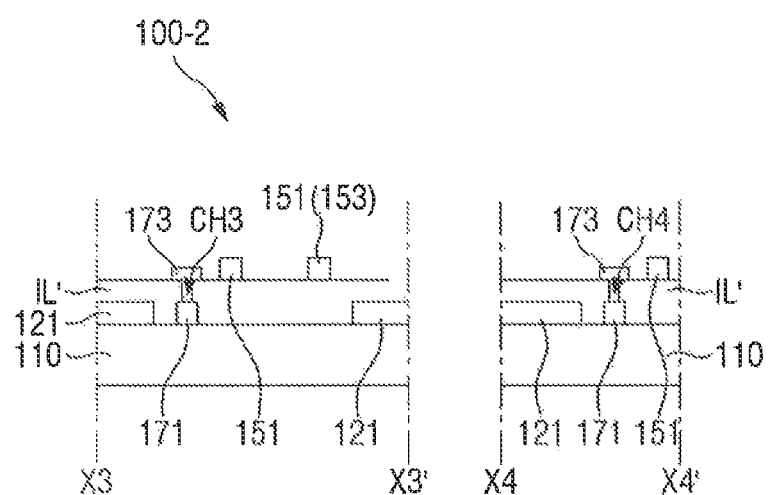
FIG. 20 is a cross-sectional view, taken along lines X3-X3' and X4-X4' of FIG. 5, of the sensor unit of FIG. 16.
Figure 21:
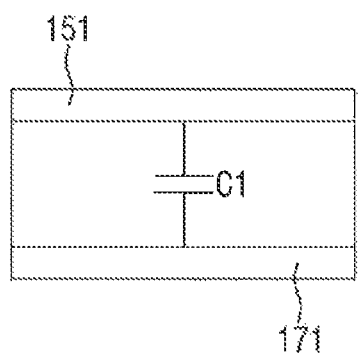
FIGS. 21 and 22 are schematic views of a sensing operation using first and second pressure sensing electrodes.
Figure 22:
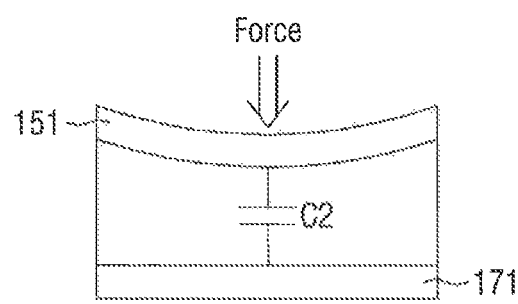

FIG. 16 is an enlarged plan view of a first layer of a sensor unit of the touch sensor of FIG. 2. FIG. 17 is an enlarged plan view of a second layer of the sensor unit of FIG. 16. FIG. 18 is a cross-sectional view, taken along line X1-X1' of FIG. 5, of the sensor unit of FIG. 16. FIG. 19 is a cross-sectional view, taken along line X2-X2' of FIG. 5, of the sensor unit of FIG. 16. FIG. 20 is a cross-sectional view, taken along lines X3-X3' and X4-X4' of FIG. 5, of the sensor unit of FIG. 16. FIGS. 21 and 22 are schematic views of a sensing operation using first and second pressure sensing electrodes.

Referring to FIGS. 16 through 22, a sensor unit 100-2 is substantially the same as the sensor unit 100 described above with reference to FIGS. 6 through 12 in that an insulating layer IL' may have elasticity, and that first pressure sensing electrodes 151 may be disposed in a second layer L2 spaced apart from a first layer L1. Thus, the sensor unit 100-2 will be described in more detail below focusing on the differences with the sensor unit 100.

The insulating layer IL' may have dielectricity and may be an elastic member with elasticity. For example, the insulating layer IL' may be deformed by external pressure applied thereto and may be elastic enough to return to its original state once the external pressure is removed.

In an exemplary embodiment of the present invention, the insulating layer IL' may include an insulating material with elasticity. For example, the insulating material may be a thermoplastic elastomer, polystyrene, polyolefin, a polyurethane thermoplastic elastomer, polyamide, synthetic rubber, polydimethylsiloxane, polybutadiene, polyisobutylene, poly (styrene-butadiene-styrene), polyurethane, polychloroprene, polyethylene, silicone, or a combination thereof, but exemplary embodiments of the present invention are not limited thereto.

The first pressure sensing electrodes 151 and second pressure sensing electrodes 171 may be disposed in different layers from each other. For example, the second pressure sensing electrodes 171, like first touch electrodes 121, may be disposed in the first layer L1, and the first pressure sensing electrodes 151, like first and second connecting lines 153 and 173, may be disposed in the second layer L2. The first pressure sensing electrodes 151 may be disposed on the insulating layer IL'.

As described above, the first pressure sensing electrodes 151 and the first connecting line 153 may be disposed in the same layer as each other (e.g., in the second layer L2). Thus, in the insulating layer IL', second contact holes CH2 for connecting the first pressure sensing electrodes 151 and the first connecting line 153 might not be formed.

Alternatively, the second pressure sensing electrodes 171 may be disposed in the second layer L2, and the first pressure sensing electrodes 151 may be disposed in the first layer L1.

When no pressure is applied to the sensor unit 100-2, first static capacitance C1 may be formed between the first pressure sensing electrodes 151 and the second pressure sensing electrodes 171 (see, e.g., FIG. 21).

When pressure is applied to the sensor unit 100-2 (e.g., in response to the sensor unit 100-2 being touched by a user), the insulating layer IL' may be deformed by the pressure, and as a result, the distance between the first pressure sensing electrodes 151 and the second pressure sensing electrodes 171 may change. Accordingly, the static capacitance between the first pressure sensing electrodes 151 and the second pressure sensing electrodes 171 may change. For example, the first static capacitance C1 may change to second static capacitance C2 due to the pressure applied to the sensor unit 100-2. As the pressure applied to the sensor unit 100-2 increases, the static capacitance between the first pressure sensing electrodes 151 and the second pressure sensing electrodes 171 may increase.

The pressure detector 230 may acquire a static capacitance variation from the first pressure sensing electrodes 151 as the second sensing signal RFs and may detect the intensity of touch pressure based on the acquired static capacitance variation.

Figure 23:
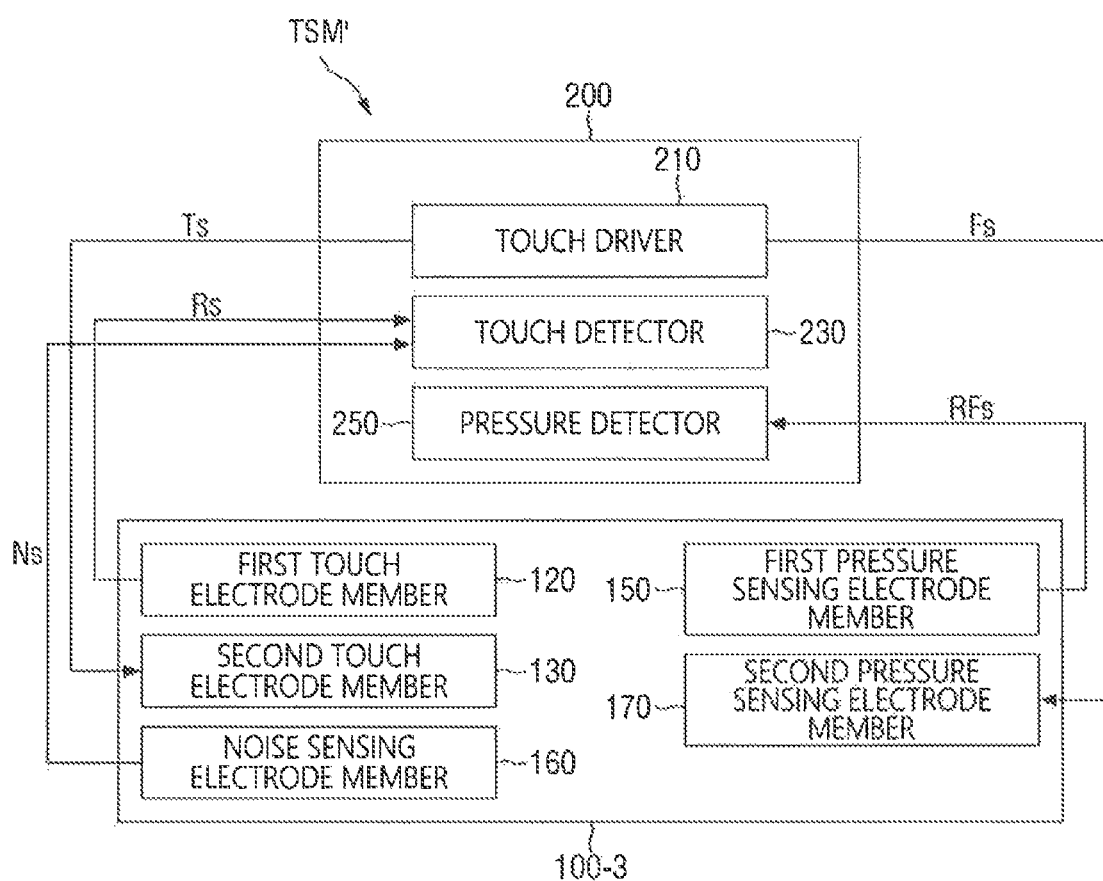
FIG. 23 is a block diagram of a touch sensor according to an exemplary embodiment of the present invention.

FIG. 23 is a block diagram of a touch sensor according to an exemplary embodiment of the present invention.

Referring to FIG. 23, a touch sensor TSM' may include a sensor unit 100-3 and a touch controller 200.

The sensor unit 100-3 may include first touch electrode members 120, second touch electrode members 130, first pressure sensing electrode members 150, and second pressure sensing electrode members 170 and may further include noise sensing electrode members 160.

The noise sensing electrode members 160 may be electrically connected to the touch controller 200, for example, to a touch detector 230 of the touch controller 200. The noise sensing electrode members 160 may sense noise generated by the sensor unit 100-3 and may provide the sensed noise to the touch detector 230 as a third sensing signal Ns.

The touch detector 230 may receive a first sensing signal Rs from the first touch electrode members 120, may receive the third sensing signal Ns, which is a noise signal, from the noise sensing electrode members 160, and may remove or offset noise included in the first sensing signal Rs using the third sensing signal Ns. The other elements of the touch sensor TSM' may be substantially the same as their respective counterparts of the touch sensor TSM, and thus, duplicative descriptions may be omitted herein.

The sensor unit 100-3 will be described in more detail below with reference to FIGS. 24 through 30.

Figure 24:
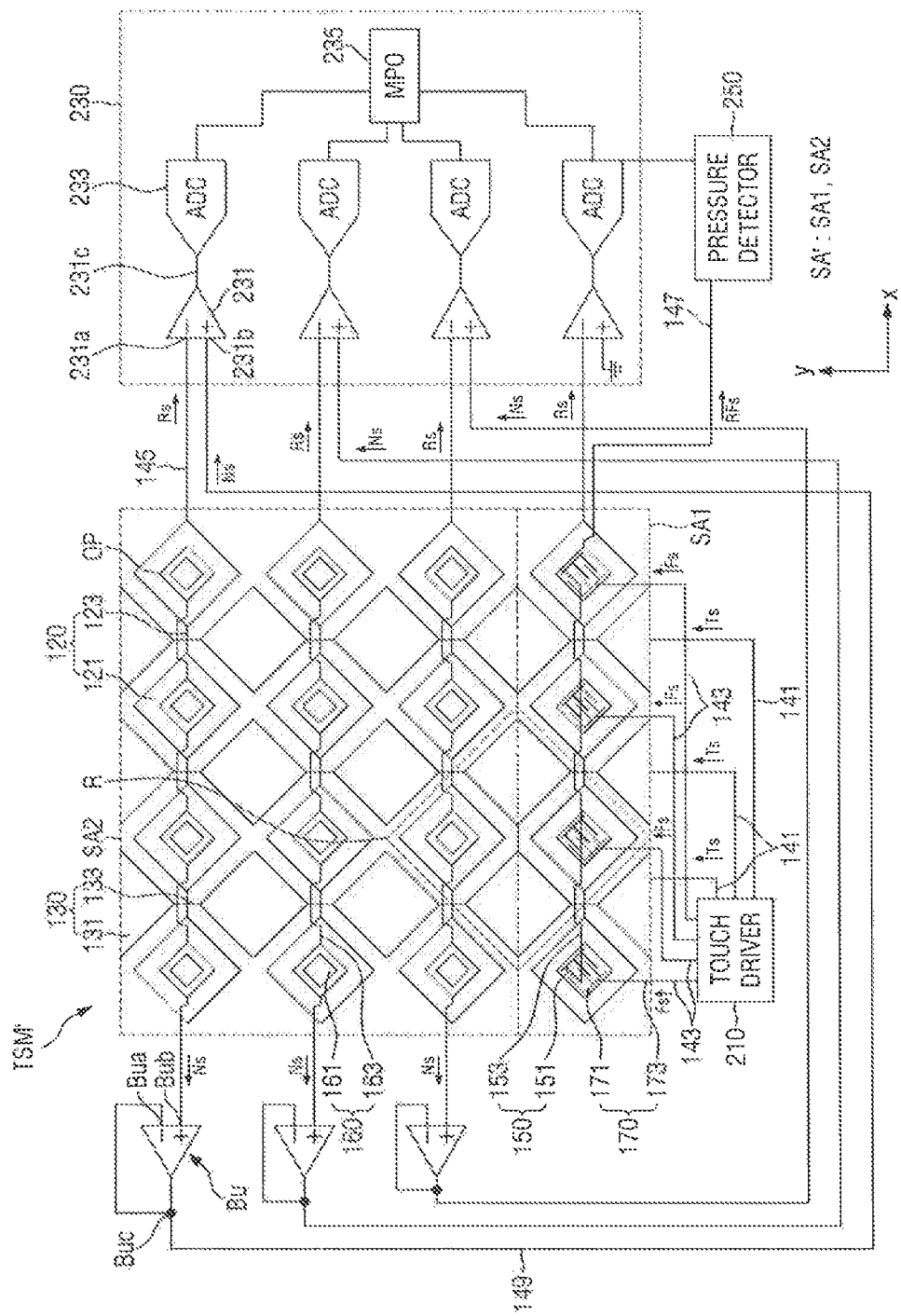
FIG. 24 is a schematic view of the touch sensor of FIG. 23.
Figure 25:
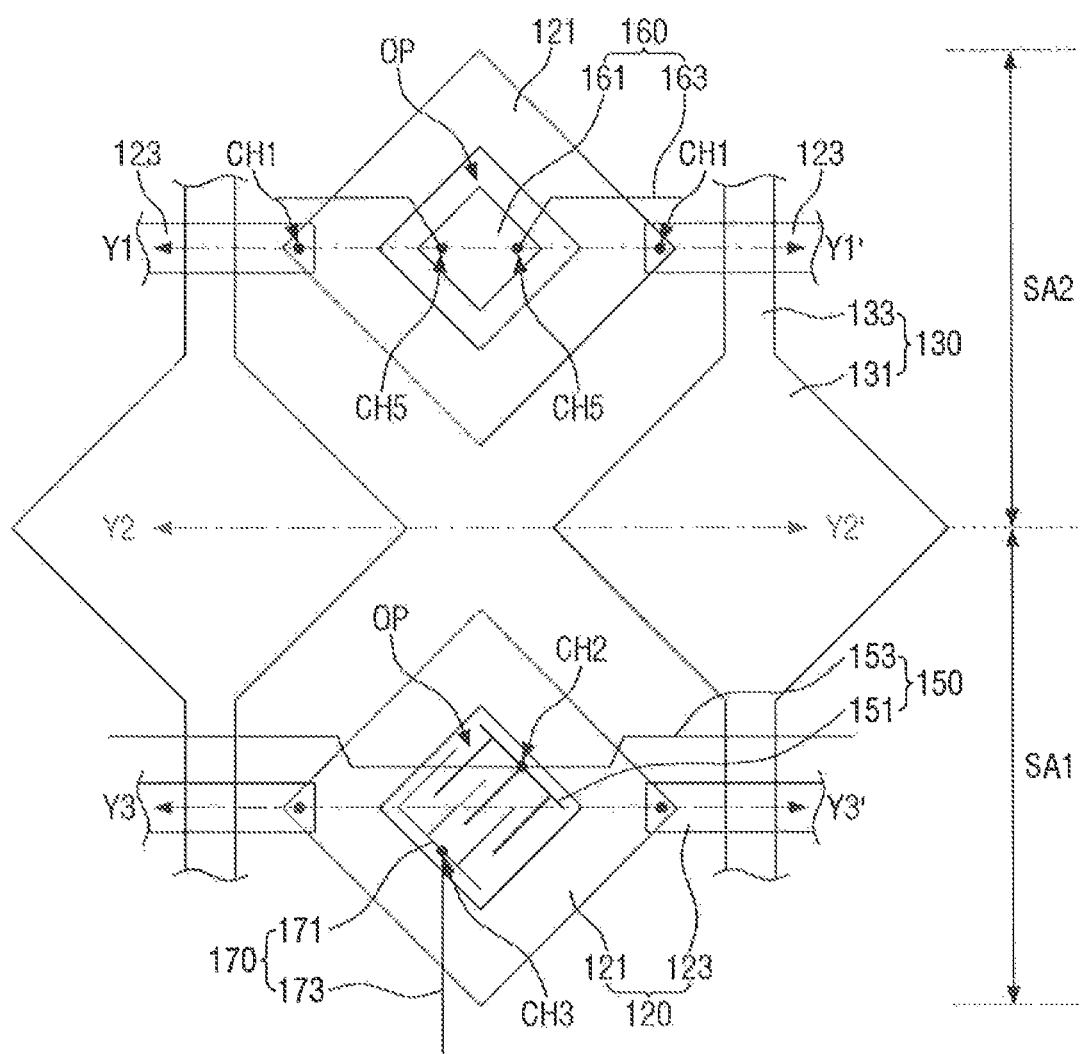
FIG. 25 is an enlarged plan view of a portion of FIG. 24.
Figure 26:
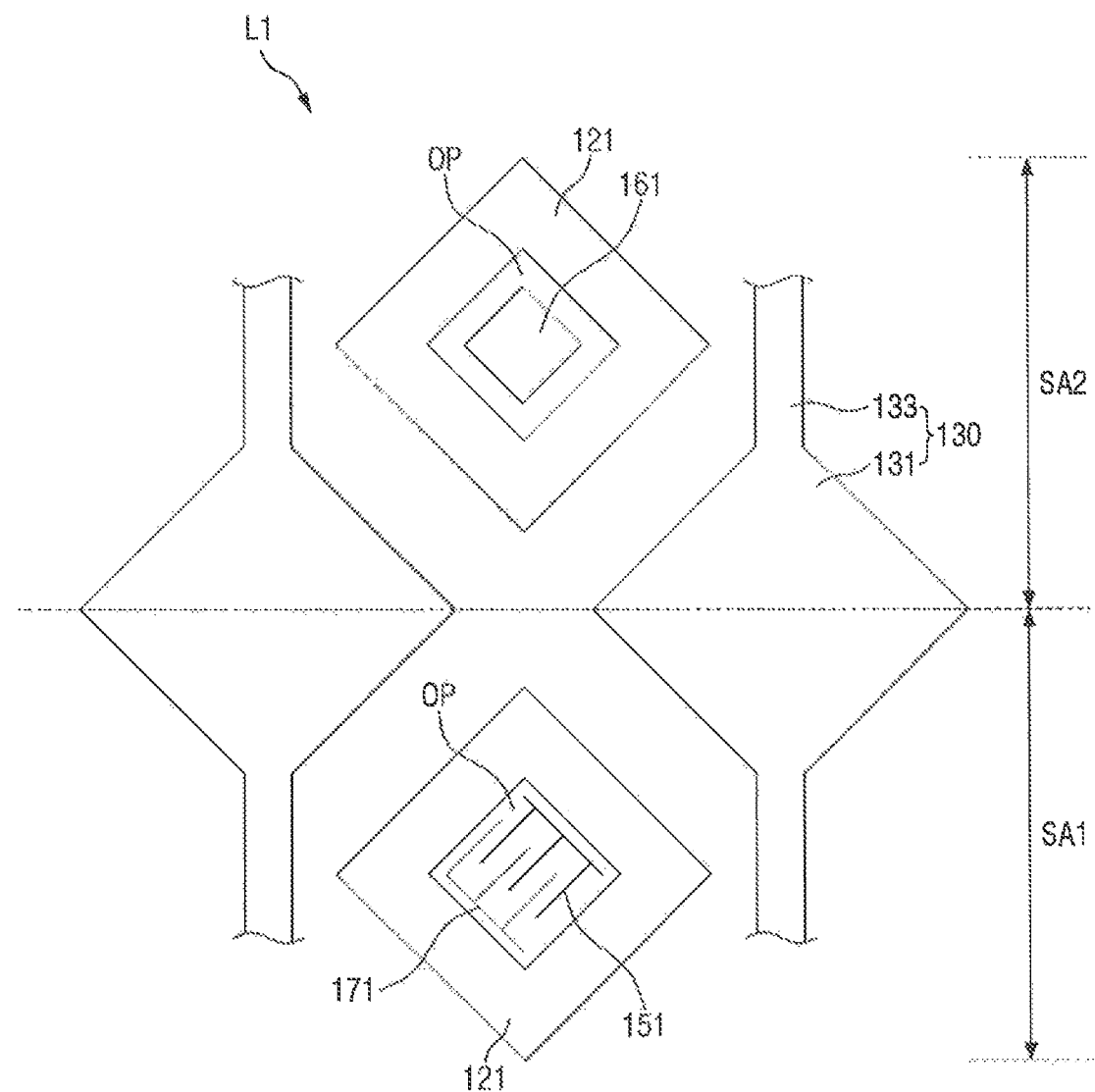
FIG. 26 is an enlarged plan view of a first layer of the sensor unit of FIG. 25.
Figure 27:
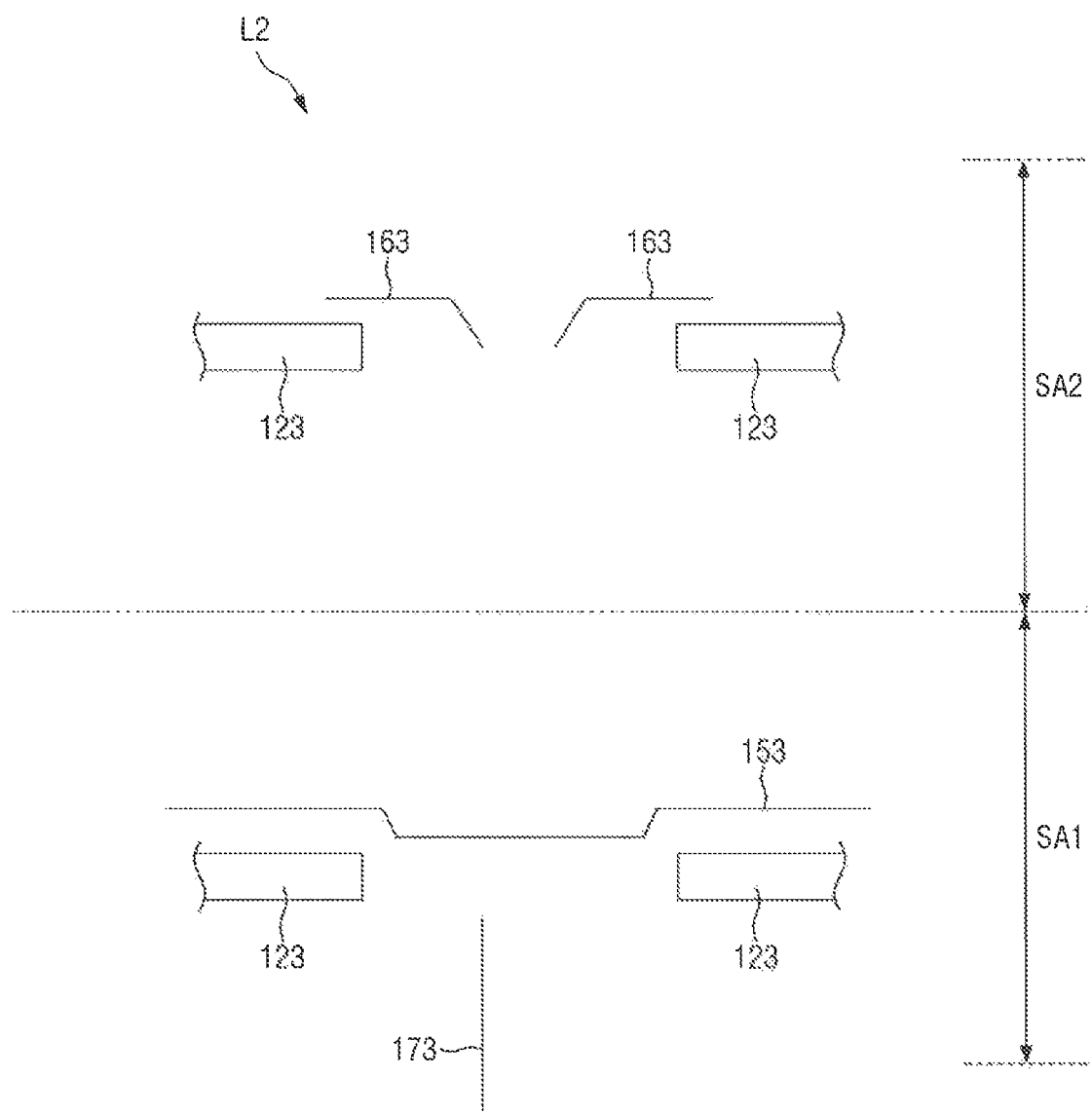
FIG. 27 is an enlarged plan view of a second layer of the sensor unit of FIG. 25.
Figure 28:
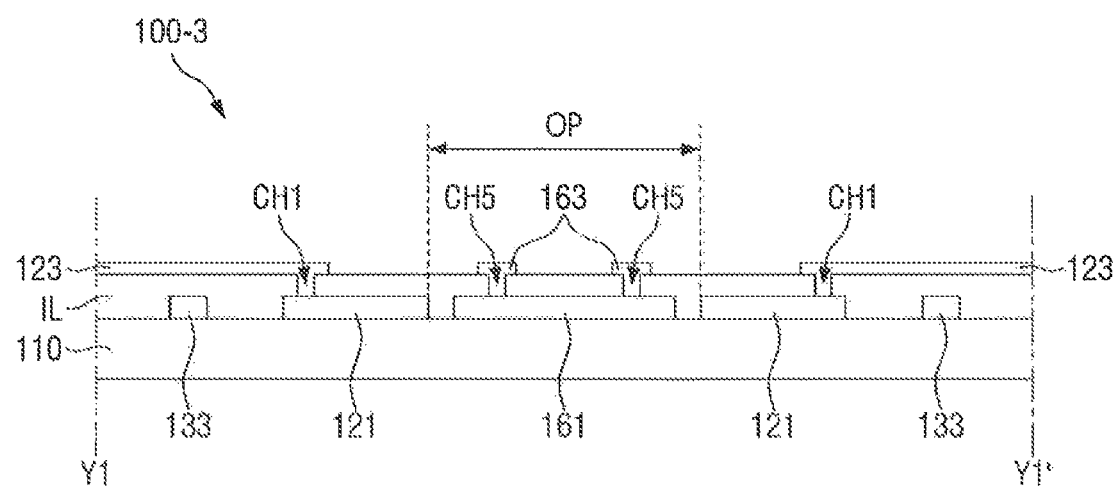
FIG. 28 is a cross-sectional view taken along line Y1-Y1' of FIG. 25.
Figure 29:
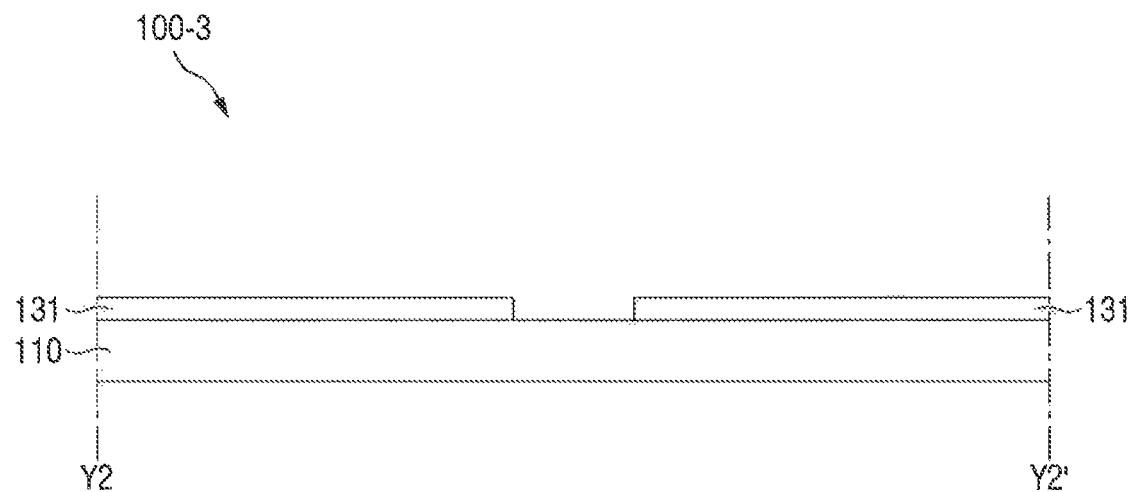
FIG. 29 is a cross-sectional view taken along line Y2-Y2' of FIG. 25.
Figure 30:
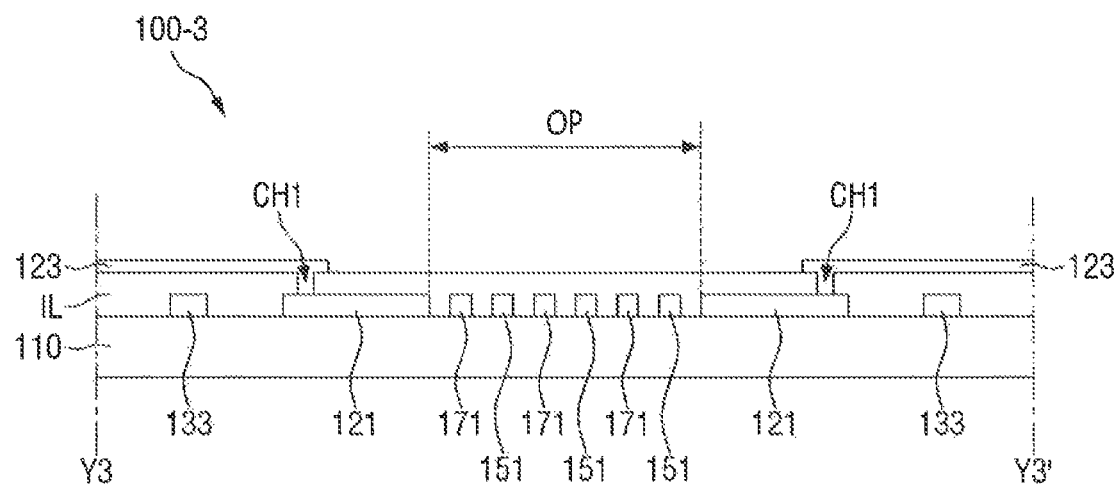
FIG. 30 is a cross-sectional view taken along line Y3-Y3' of FIG. 25.

FIG. 24 is a schematic view of the touch sensor of FIG. 23. FIG. 25 is an enlarged plan view of a portion R of FIG. 24. FIG. 26 is an enlarged plan view of a first layer of the sensor unit of FIG. 25. FIG. 27 is an enlarged plan view of a second layer of the sensor unit of FIG. 25. FIG. 28 is a cross-sectional view taken along line Y1-Y1' of FIG. 25. FIG. 29 is a cross-sectional view taken along line Y2-Y2' of FIG. 25. FIG. 30 is a cross-sectional view taken along line Y3-Y3' of FIG. 25.

Referring to FIGS. 24 through 30, the sensor unit 100-3 may include the base layer 110, the first touch electrode members 120, the second touch electrode members 130, the first pressure sensing electrode members 150, the second pressure sensing electrode members 170, and the noise sensing electrode members 160.

The base layer 110 may include the sensing area SA and a non-sensing area NSA. The sensing area SA may include a first area SA1 and a second area SA2, which is spaced apart from the first area SA1.

In an exemplary embodiment of the present invention, the first area SA1 may be a part of the sensing area SA adjacent to the display driver 400 of the display device 1, and the second area SA2 may be a part of the sensing area SA relatively distant from the display driver 400. Thus, the first area SA1 may be relatively closer to the display driver 400 than the second area SA2.

In an exemplary embodiment of the present invention, the first area SA1 may be a part of the sensing area SA adjacent to the touch driver 210 of the display device 1, and the second area SA2 may be a part of the sensing area SA relatively distant from the touch driver 210. Thus, the first area SA1 may be relatively closer to the touch driver 210 than the second area SA2.

In the first and second areas SA1 and SA2 of the base layer 110, the first touch electrode members 120, the second touch electrode members 130, which are spaced apart from (e.g., are insulated from) the first touch electrode members 120, the first pressure sensing electrode members 150, and the second pressure sensing electrode members 170 may be disposed.

Each of the first touch electrode members 120 may include a plurality of first touch electrodes 121 arranged in the first direction X and first connectors 123 electrically connecting adjacent first touch electrodes 121 in the first direction X.

The first touch electrodes 121 may each include openings (e.g., holes) OP.

Each of the second touch electrode members 130 may include a plurality of second touch electrodes 131 arranged along the second direction Y and second connectors 133 electrically connecting adjacent second touch electrodes 131 in the second direction Y.

Each of the first pressure sensing electrode members 150 may include a plurality of first pressure sensing electrodes 151 and the first connecting line 153.

The first pressure sensing electrodes 151 may be disposed in the openings OP of the first touch electrodes 121 and may be spaced apart from the first touch electrodes 121.

The first connecting line 153 may electrically connect adjacent first pressure sensing electrodes 151 in the first direction X and may be in direct contact with the first pressure sensing electrodes 151.

Each of the second pressure sensing electrode members 170 may include a plurality of second pressure sensing electrodes 171 and the second connecting line 173.

The second pressure sensing electrodes 171 may be disposed in the openings OP of the first touch electrodes 121 and may be spaced apart from the first touch electrodes 121 and the first pressure sensing electrodes 151.

The second connecting line 173 may electrically connect adjacent second pressure sensing electrodes 171 in the second direction y and may be in direct contact with the second pressure sensing electrodes 171.

In an exemplary embodiment of the present invention, an insulating layer IL may be disposed between the second pressure sensing electrodes 171 and the second connecting line 173, and the second connecting line 173 may be in direct contact with the second pressure sensing electrodes 171 via third contact holes CH3 and fourth contact holes CH4, which are formed in the insulating layer IL.

In an exemplary embodiment of the present invention, the second pressure sensing electrodes 171 may be driving electrodes receiving second driving signal Fs to detect touch pressure, and the first pressure sensing electrodes 151 may be sensing electrodes outputting second sensing signal RFs to detect touch pressure.

The first touch electrodes 121, the second touch electrodes 131, the second connectors 133, the first pressure sensing electrodes 151, and the second pressure sensing electrodes 171 may be disposed in a first layer L1, and the first connectors 123, the first connecting line 153, and the second connecting line 173 may be disposed in a second layer L2, which is spaced apart from the first layer L1. In an exemplary embodiment of the present invention, the elements disposed in the second layer L2 may be disposed on the insulating layer IL.

The first pressure sensing electrode members 150 and the second pressure sensing electrode members 170 may be disposed in the first area SA1 of the sensing area SA, but not in the second area SA2 of the sensing area SA. For example, the first pressure sensing electrodes 151 and the second pressure sensing electrodes 171 may be disposed in the openings OP of the first touch electrodes 121, which are disposed in the first area SA1.

In the second area SA2, the noise sensing electrode members 160 may be provided. The noise sensing electrode members 160 may sense noise introduced into the sensor unit 100-3 from the display panel 300.

Each of the noise sensing electrode members 160 may include noise sensing electrodes 161 and a third connecting line 163.

The noise sensing electrodes 161 may be disposed in the second area SA2 in the openings OP of the first touch electrode 121 and may be spaced apart from the first touch electrodes 121. In an exemplary embodiment of the present invention, the noise sensing electrodes 161 may be disposed in a same layer as the first touch electrodes 121 (e.g., in the first layer L1), and may be in direct contact with the base layer 110.

The noise sensing electrodes 161 may include a conductive material. The noise sensing electrodes 161 may include a transparent conductive material. Thus, the noise sensing electrodes 161 may be substantially transparent. In an exemplary embodiment of the present invention, the noise sensing electrodes 161 may include a same material as the first touch electrodes 121.

The insulating layer IL may be disposed on the noise sensing electrodes 161, and the third connecting line 163 may be disposed on the insulating layer IL. The third connecting line 163 may electrically connect adjacent noise sensing electrodes 161 in the first direction X. In an exemplary embodiment of the present invention, the third connecting line 163 may be in direct contact with the noise sensing electrodes 161 via fifth contact holes CH5, which are formed in the insulating layer IL.

The third connecting line 163 may be spaced apart from the first touch electrode members 120, the second touch electrode members 130, the first pressure sensing electrode members 150, and the second pressure sensing electrode members 170.

In an exemplary embodiment of the present invention, the third connecting line 163 may be disposed in a same layer as the first and second connecting lines 153 and 173 (e.g., in the second layer L2). The third connecting line 163 may include a conductive material. In an exemplary embodiment of the present invention, the third connecting line 163 may include a same material as the first and second connecting lines 153 and 173.

In an exemplary embodiment of the present invention, in the non-sensing area NSA of the base layer 110, wires (e.g., wires 141, 143, 145, 147, and/or 149) may be provided. For example, the wires (e.g., 141, 143, 145, 147, and/or 149) may include first wires 141 electrically connecting the second touch electrode members 130 and a touch driver 210, second wires 143 electrically connecting the second pressure sensing electrode members 170 and the touch driver 210, third wires 145 electrically connecting the first pressure sensing electrode members 120 and the touch detector 230, fourth wires 147 electrically connecting the first pressure sensing electrode members 150 and a pressure detector 250, and fifth wires 149 electrically connecting the noise sensing electrode members 160 and the touch detector 230.

The touch driver 210 may provide a first driving signal Ts to the second touch electrode members 130 via the first wires 141 and may provide a second driving signal Fs to the second pressure sensing electrode members 170 via the second wires 143.

The pressure detector 250 may receive the second sensing signal RFs from the first pressure sensing electrode members 150 via the fourth wires 147.

The touch detector 230 may receive the first sensing signal Rs from the first touch electrode members 120 via the third wires 145 and may receive the third sensing signal Ns, which is a noise signal, from the noise sensing electrode members 160 via the fifth wires 149.

In an exemplary embodiment of the present invention, the third sensing signal Ns may be provided to second input terminals 231b of amplifiers 231, which may be non-inverting input terminals. Accordingly, the reference voltage of the amplifiers 231 may vary in accordance with the voltage of the noise sensing electrode members 160. For example, the reference electric potential of the amplifiers 231 may vary in accordance with the electric potential (e.g., or the voltage) of the noise sensing electrode members 160.

The electric potential of the noise sensing electrode members 160 may vary in accordance with a noise signal introduced to the sensor unit 100-3 from the display panel 300. For example, the electric potential of the noise sensing electrode members 160 may vary in accordance with common-mode noise introduced to the sensor unit 100-3 from the display panel 300.

Thus, the noise sensing electrode members 160 may be disposed in the sensing area SA, and the common-mode noise introduced to the sensor unit 100-3 can be offset (e.g., or removed) by changing the reference electric potential of the amplifiers 231 using the third sensing signal Ns sensed by the noise sensing electrode members 160. For example, the first touch electrode members 120 and the noise sensing electrode members 160, which are sensing electrode members, may have ripples corresponding to the common-mode noise. For example, the first touch electrode members 120 and the noise sensing electrode members 160 may extend in a same direction as in other in the sensing area SA, and thus may receive noise signals of the same pattern and/or intensity (e.g., or of similar patterns and/or intensities). The first touch electrode members 120 may be electrically connected to first input terminals 231a of the amplifiers 231 via the third wires 145, and the noise sensing electrode members 160 may be electrically connected to the second input terminals 231b of the amplifiers 231 via the fifth wires 149, which are spaced apart from the third wires 145. Thus, noise components (e.g., or ripples) included in the first sensing signal Rs received from the first touch electrode members 120 can be effectively offset. Accordingly, signals output by output terminals 231c of the amplifiers 231 may be as sensing signals with noise removed therefrom.

One or more buffers Bu may be provided between the noise sensing electrode members 160 and the touch detector 230. The buffers Bu may be connected between the noise sensing electrode members 160 and the touch detector 230 and buffer and output the third sensing signal Ns (e.g., a noise signal) input thereto from the noise sensing electrode members 160. The buffers Bu may include third input terminals Bua electrically connected to output terminals Buc and fourth input terminals Bub electrically connected to the noise sensing electrode members 160 and receiving the third sensing signal Ns. The third input terminals Bua and the fourth input terminals Bub may be inverting input terminals and non-inverting input terminals, respectively, but exemplary embodiments of the present invention are not limited thereto. For example, the connecting structure of the buffers Bu may vary.

The touch sensor TSM' can effectively offset noise signals introduced from the display panel 300 and can improve a signal-to-noise ratio (SNR). Accordingly, the malfunction of the touch sensor TSM' that may be caused by noise signals can be reduced or eliminated, and the sensing sensitivity of the touch sensor TSM' can be increased.

The sensor unit 100-3 may be disposed on the TFE layer of the display panel 300. Accordingly, since the sensor unit 100-3 may be a relatively short distance apart from the display panel 300, the touch sensor TSM' can be useful for a display device that is relatively sensitive to noise.

Figure 31:
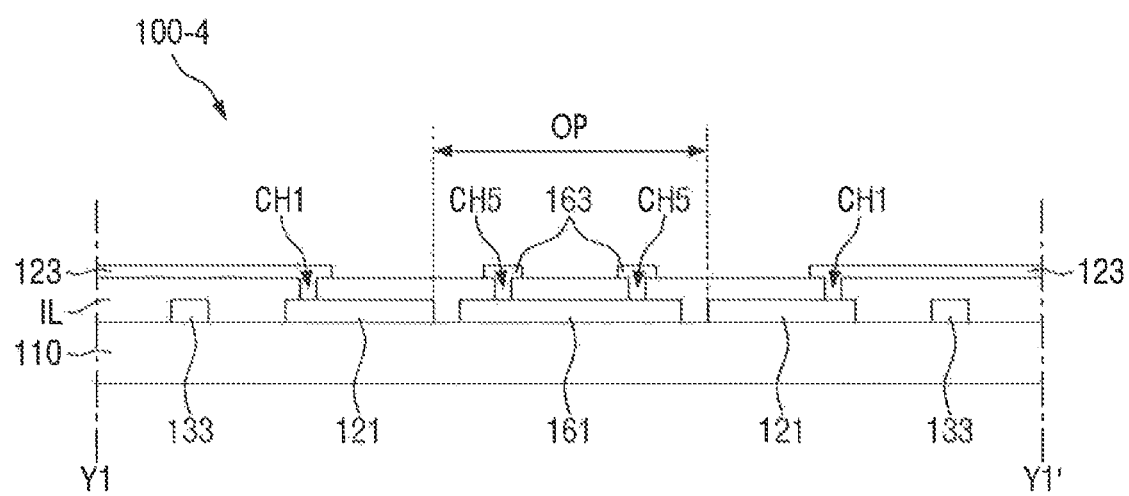
FIG. 31 is a cross-sectional view, taken along line Y1-Y1' of FIG. 25, of a sensor unit of the touch sensor of FIG. 23.
Figure 32:
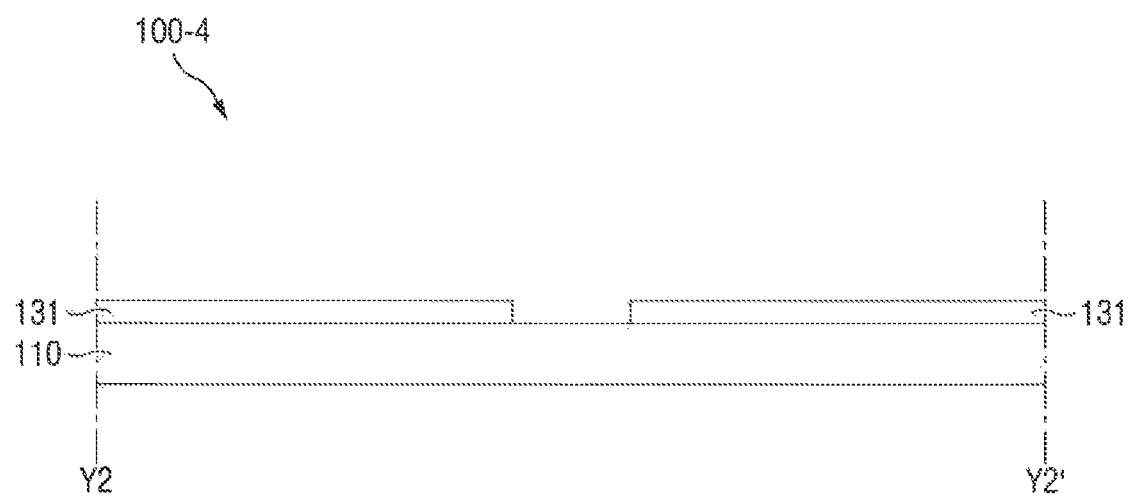
FIG. 32 is a cross-sectional view, taken along line Y2-Y2' of FIG. 25, of the sensor unit of FIG. 31.
Figure 33:
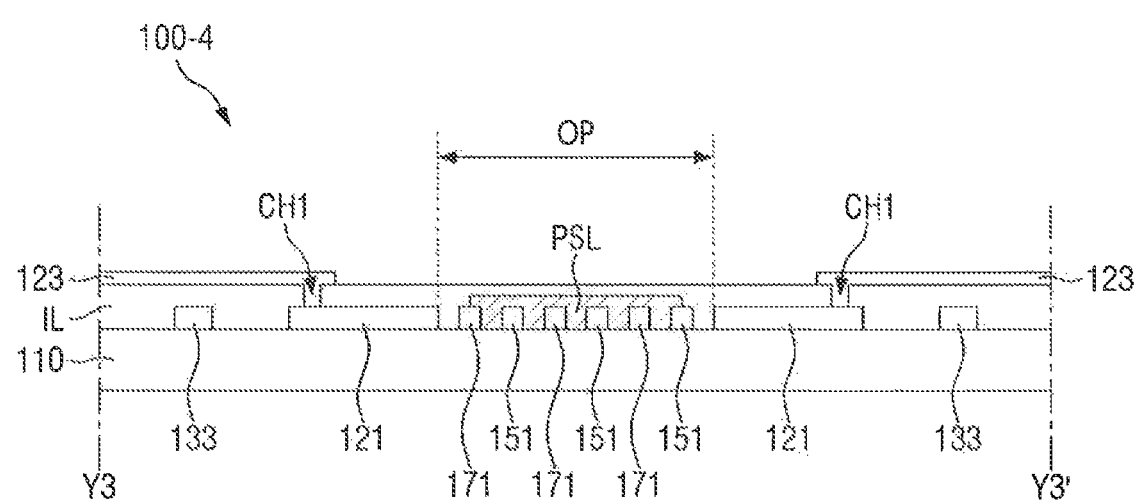
FIG. 33 is a cross-sectional view, taken along line Y3-Y3' of FIG. 25, of the sensor unit of FIG. 31.

FIG. 31 is a cross-sectional view, taken along line Y1-Y1' of FIG. 25, of a sensor unit of the touch sensor of FIG. 23. FIG. 32 is a cross-sectional view, taken along line Y2-Y2' of FIG. 25, of the sensor unit of FIG. 31. FIG. 33 is a cross-sectional view, taken along line Y3-Y3' of FIG. 25, of the sensor unit of FIG. 31.

Referring to FIGS. 31 through 33, a sensor unit 100-4 is substantially the same as the sensor unit 100-3 described above except that it further includes a pressure sensing layer PSL.

The pressure sensing layer PSL may be disposed in the first area SA1 of the sensing area SA, but not in a second area SA2 of the sensing area SA.

The pressure sensing layer PSL may be disposed in the first area SA1 in openings OP of first touch electrodes 121. The pressure sensing layer PSL may be disposed on first pressure sensing electrodes 151 and second pressure sensing electrodes 171 and may partially cover the first pressure sensing electrodes 151 and the second pressure sensing electrodes 171. The pressure sensing layer PSL may be in direct contact with upper and side surfaces of the first pressure sensing electrodes 151 and the second pressure sensing electrodes 171. The pressure sensing layer PSL may be disposed in the openings OP and may be spaced apart from the first touch electrodes 121. In an exemplary embodiment of the present invention, the pressure sensing layer PSL may be disposed below an insulating layer IL. An upper surface and side surfaces of the pressure sensing layer PSL may be substantially covered by the insulating layer IL.

The pressure sensing layer PSL described with reference to FIGS. 31-33 may be substantially the same as the pressure sensing layer PSL described above with reference to FIGS. 14 and 15, and thus, duplicative descriptions may be omitted.

Figure 34:
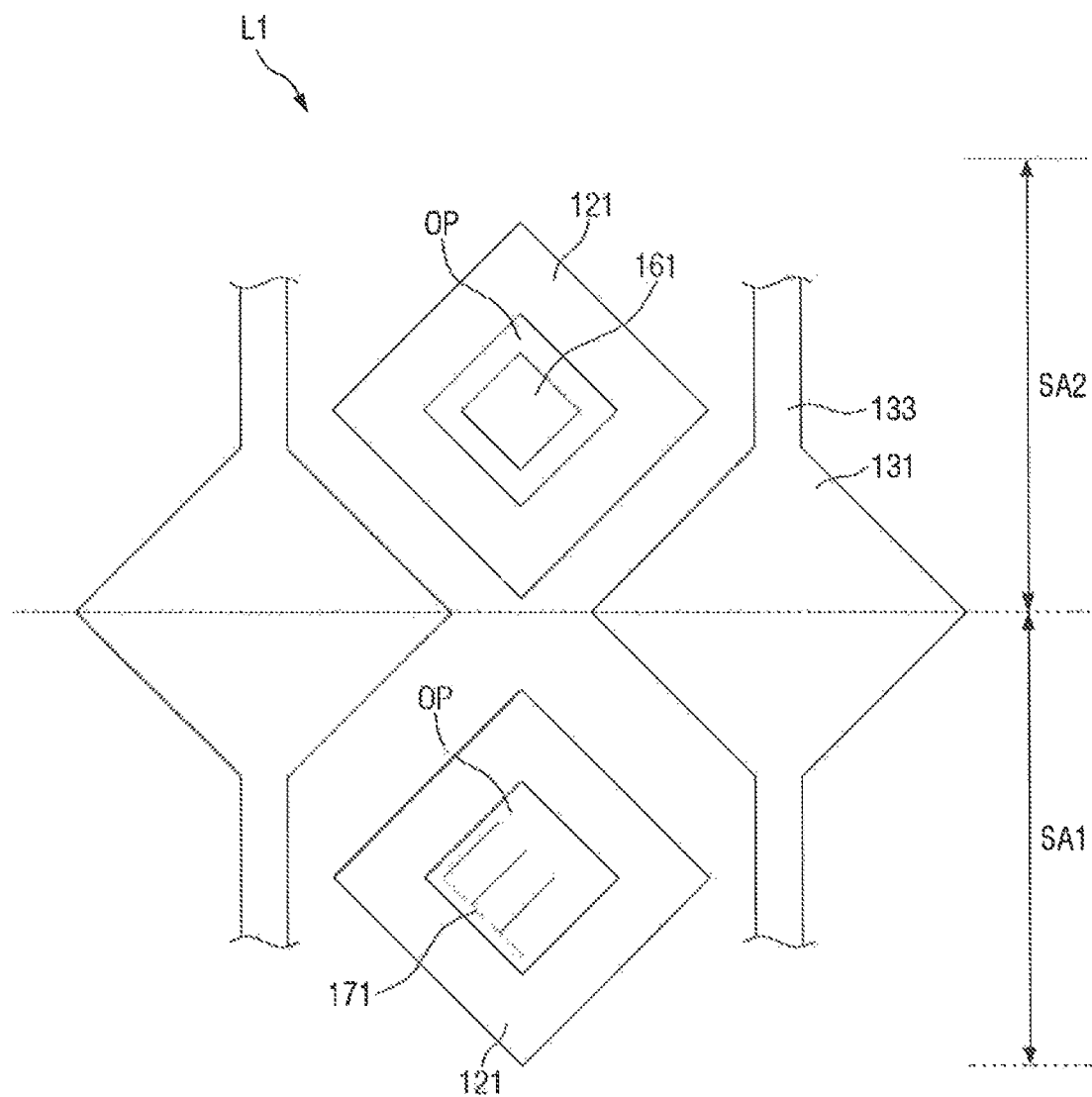
FIG. 34 is an enlarged plan view of a first layer of a sensor unit of the touch sensor of FIG. 23.
Figure 35:
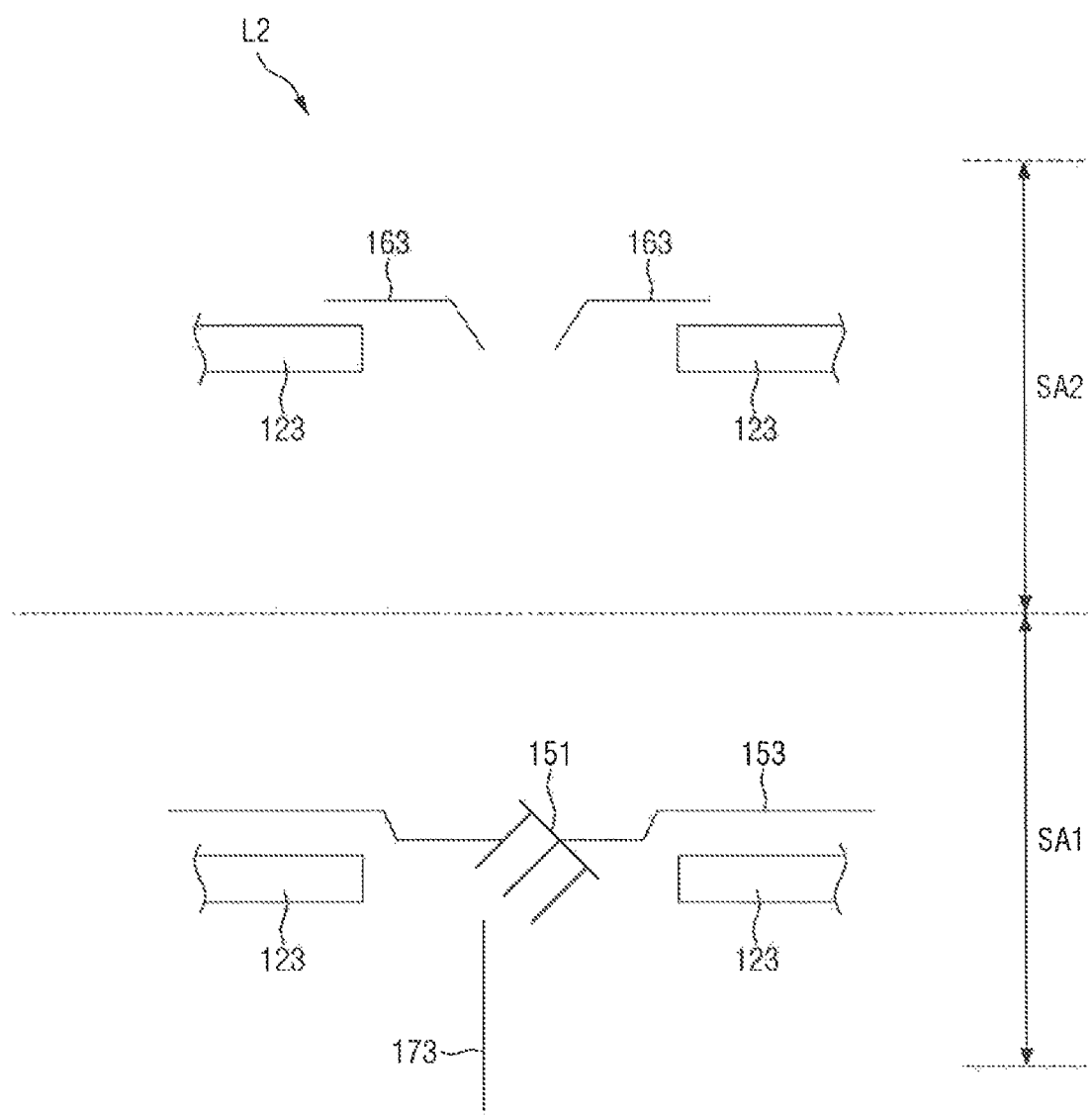
FIG. 35 is an enlarged plan view of a second layer of the sensor unit of FIG. 34.
Figure 36:
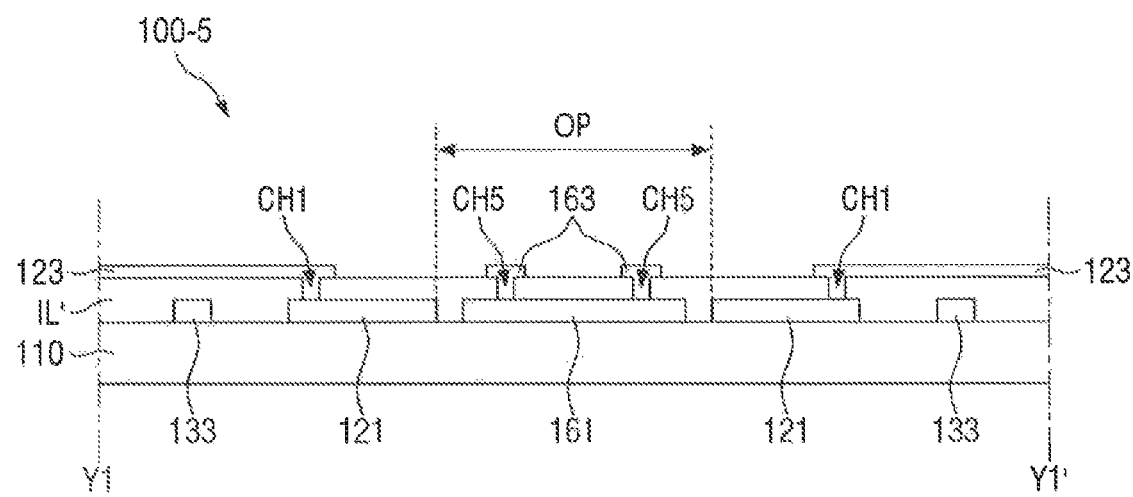
FIG. 36 is a cross-sectional view, taken along line Y1-Y1' of FIG. 25, of the sensor unit of FIG. 34.
Figure 37:
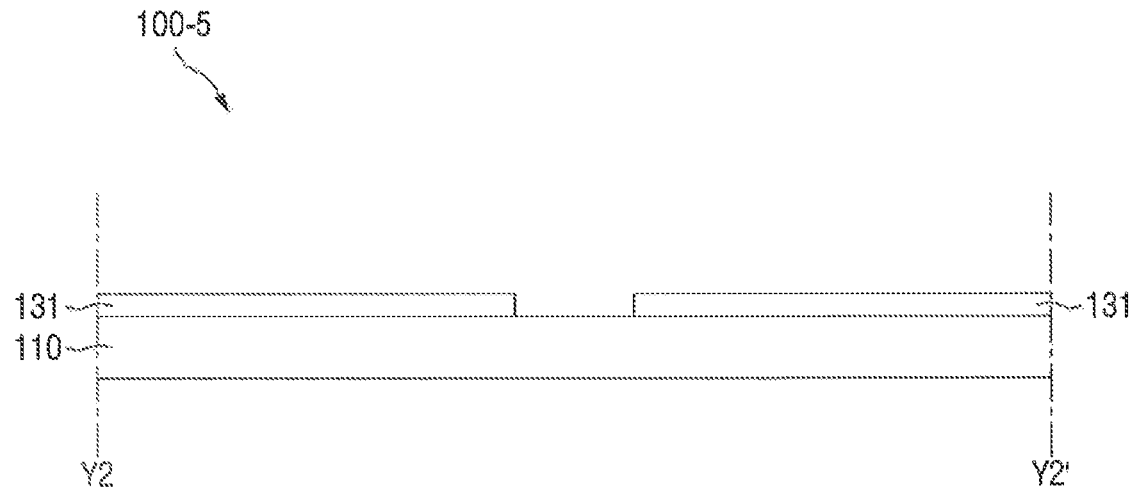
FIG. 37 is a cross-sectional view, taken along line Y2-Y2' of FIG. 25, of the sensor unit of FIG. 34.
Figure 38:
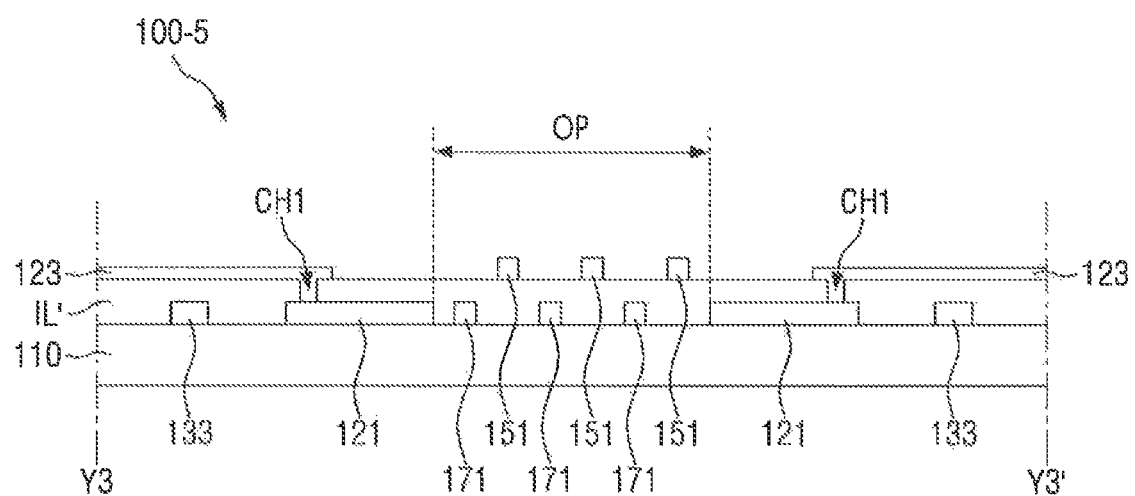
FIG. 38 is a cross-sectional view, taken along line Y3-Y3' of FIG. 25, of the sensor unit of FIG. 34.

FIG. 34 is an enlarged plan view of a first layer of a sensor unit of the touch sensor of FIG. 23. FIG. 35 is an enlarged plan view of a second layer of the sensor unit of FIG. 34. FIG. 36 is a cross-sectional view, taken along line Y1-Y1' of FIG. 25, of the sensor unit of FIG. 34. FIG. 37 is a cross-sectional view, taken along line Y2-Y2' of FIG. 25, of the sensor unit of FIG. 34. FIG. 38 is a cross-sectional view, taken along line Y3-Y3' of FIG. 25, of the sensor unit of FIG. 34.

Referring to FIGS. 34 through 38, a sensor unit 100-5 is substantially the same as the sensor unit 100-3 described above, and thus differences will be focused on below.

An insulating layer IL' may have elasticity. First pressure sensing electrodes 151 may be disposed in a second layer L2, rather than in a first layer L1.

The insulating layer may have dielectricity and may be an elastic member with elasticity.

The first pressure sensing electrodes 151 and second pressure sensing electrodes 171 may be disposed in different layers from each other. For example, the second pressure sensing electrodes 171, like first touch electrodes 121, may be disposed in the first layer L1, and the first pressure sensing electrodes 151, like first and second connecting lines 153 and 173, may be disposed in the second layer L2. The first pressure sensing electrodes 151 may be disposed on the insulating layer IL'.

The insulating layer IL' and the detection of the intensity of touch pressure using the first pressure sensing electrodes 151 and the second pressure sensing electrodes 171 may be as described above with reference to FIGS. 16 through 22, and thus, duplicative descriptions may be omitted.

The touch sensors according to an exemplary embodiment of the present invention can detect not only a touch input, but also the intensity of touch pressure. Accordingly, the touch sensors according to an exemplary embodiment of the present invention can replace, or can be used together with, existing physical input buttons. Since the touch sensors according to an exemplary embodiment of the present invention can detect the intensity of a user input or pressure, the touch sensors according to an exemplary embodiment of the present invention can be used as input devices for the display device 1 and can provide various user interfaces. For example, the touch sensors according to an exemplary embodiment of the present invention can detect the presence and the intensity of pressure applied thereto. Also, the touch sensors according to an exemplary embodiment of the present invention can allow the display device 1 to perform various preprogrammed operations in accordance with the presence and/or the intensity of pressure applied to a particular location thereof. For example, the display device 1 may perform various preprogrammed operations such as adjusting, locking, or converting a screen, calling and executing applications, taking pictures, or receiving calls.

The touch sensors according to an exemplary embodiment of the present invention can offset noise introduced from the display panel 300 and can thus increase touch sensitivity.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A touch sensor comprising:
a base layer having a first area and a second area, which is spaced apart from the first area;
a plurality of first touch electrodes disposed in the second area, arranged in a first direction, including openings, and electrically connected to one another;
a plurality of second touch electrodes disposed on the base layer, arranged in a second direction, which intersects the first direction, and electrically connected to one another;
first pressure sensing electrodes and second pressure sensing electrodes disposed in the first area, wherein the first pressure sensing electrodes and the second pressure sensing electrodes are separated from each other and disposed in the openings of the first touch electrodes in a plan view, wherein the first pressure sensing electrodes and second pressure sensing electrodes are spaced apart from the first touch electrodes, wherein the first pressure sensing electrodes, the second pressure sensing electrodes, the first touch electrodes, and the second touch electrodes are disposed in a first layer;
noise sensing electrodes detecting a noise signal, wherein the noise sensing electrodes are disposed in the second area in the openings of the first touch electrodes and are separated from the second touch electrodes.

2. The touch sensor of claim 1, wherein the first pressure sensing electrodes, the second pressure sensing electrodes, the first touch electrodes, and the second touch electrodes include a same material as each other.

3. The touch sensor of claim 2, further comprising:
first connectors connecting adjacent first touch electrodes in the first direction; and
second connectors connecting adjacent second touch electrodes in the second direction.

4. The touch sensor of claim 3, wherein
the first connectors or the second connectors are disposed in a second layer, which is spaced apart from the first layer, and
whichever of the first connectors or the second connectors are not disposed in the second layer are disposed in the first layer.

5. The touch sensor of claim 4, further comprising:
a first connecting line connected to the first pressure sensing electrodes and insulated from the first touch electrodes, the second touch electrodes, the first connectors, and the second connectors; and
a second connecting line connected to the second pressure sensing electrodes and insulated from the first touch electrodes, the second touch electrodes, the first connectors, and the second connectors,
wherein the first and second connecting lines are disposed in the second layer.

6. The touch sensor of claim 2, wherein
each of the first pressure sensing electrodes includes a first stem electrode and a plurality of first branch electrodes branched off from the first stem electrode,
each of the second pressure sensing electrodes includes a second stem electrode and a plurality of second branch electrodes branched off from the second stem electrode, and
the first branch electrodes and the second branch electrodes are spaced apart from each other.

7. The touch sensor of claim 2, wherein the second pressure sensing electrodes are disposed to surround the first pressure sensing electrodes in a plan view.

8. The touch sensor of claim 1, wherein
the first touch electrodes are sensing electrodes, and
the second touch electrodes are driving electrodes.

9. The touch sensor of claim 8, further comprising:
a controller electrically connected to the first touch electrodes, the second touch electrodes, the first pressure sensing electrodes, and the second pressure sensing electrodes,
wherein the controller applies a first driving signal to the second touch electrodes during a first time period and applies a second driving signal to the first pressure sensing electrodes during a second time period, the first time period and the second time period are different from each other.

10. The touch sensor of claim 9, wherein the controller receives a first sensing signal generated in response to the first driving signal from the first touch electrodes during the first time period and receives a second sensing signal generated in response to the second driving signal from the first pressure sensing electrodes during the second time period.

11. The touch sensor of claim 10, wherein the second sensing signal includes information regarding a variation in mutual static capacitance or information regarding self-capacitance.

12. The touch sensor of claim 1, further comprising:
a pressure sensing layer including a pressure sensitive material having a resistance changes in accordance with pressure,
wherein the pressure sensing layer is disposed in the openings of the first touch electrodes on the first press re sensing electrodes and on the second pressure sensing electrodes and are spaced apart from the first touch electrodes.

13. The touch sensor of claim 1, wherein the noise sensing electrodes are disposed in the first layer and include a same material as the first pressure sensing electrodes and the second pressure sensing electrodes.

14. The touch sensor of claim 1, further comprising:
a controller electrically connected to the first touch electrodes, the second touch electrodes, and the noise sensing electrodes,
wherein the controller applies a first driving signal to the second touch electrodes, receives a first sensing signal generated in response to the first driving signal from the first touch electrodes, receives a noise signal from the noise sensing electrodes, and offsets noise included in the first sensing signal using the noise signal.

15. A touch sensor comprising:
a base layer having a first area and a second area which is different from the first area;
noise sensing electrodes detecting a noise signal;
a plurality of first touch electrodes disposed on the base layer, arranged in a first direction, including openings, and electrically connected to one another;
a plurality of second touch electrodes disposed on the base layer, arranged in a second direction, which intersects the first direction, and electrically connected to one another; and
first pressure sensing electrodes disposed in the openings of the first touch electrodes in a plan view to be spaced apart from the first touch electrodes, the first pressure sensing electrodes being disposed in a same first layer as the first touch electrodes and the second touch electrodes;
an insulating layer disposed on the first pressure sensing electrodes and having elasticity;
second pressure sensing electrodes disposed on the insulating layer; and a controller electrically connected to the first touch electrodes, the second touch electrodes, the first pressure sensing electrodes, and the second pressure sensing electrodes,
wherein the controller detects a touch location by detecting a variation in static capacitance between the first touch electrodes and the second touch electrodes during a first time period, and detects touch pressure by detecting a variation in static capacitance between the first pressure sensing electrodes and the second pressure sensing electrodes during a second time period, the second time period is different from the first time period,
wherein the first pressure sensing electrodes and the second pressure sensing electrodes are disposed in the first area,
wherein the noise sensing electrodes are disposed in the second area in the openings of the first touch electrodes and are separated from the first touch electrodes.

16. The touch sensor of claim 15, further comprising:
first connectors connecting pairs of adjacent first touch electrodes in the first direction; and
second connectors connecting pairs of adjacent second touch electrodes in the second direction,
wherein
the first connectors or the second connectors are disposed in the first laYer, and
whichever of the first connectors or the second connectors are not disposed in the first layer are disposed in a second layer, which is spaced apart from the first layer.

17. The touch sensor of claim 16,
wherein
the noise sensing electrodes, the first touch electrodes, the second touch electrodes, and the first pressure sensing electrodes include a same material as each other.

18. The touch sensor of claim 17, wherein
the noise sensing electrodes are electrically connected to the controller, and
the controller receives a noise signal from the noise sensing electrodes and offsets noise included in sensing signals, received from the first touch electrodes, using the noise signal.

19. A display device, comprising:
a display panel comprising a base substrate, a thin film transistor positioned above the base substrate, an emission layer electrically connected with the thin film transistor, and a thin film encapsulation layer positioned above the emission layer;
a sensor unit disposed directly on the thin film encapsulation layer,
wherein the sensor unit comprises:
a plurality of first touch electrodes disposed on the thin film encapsulation layer, arranged in a first direction, including openings, and electrically connected to one another;
a plurality of second touch electrodes disposed on the thin film encapsulation layer, arranged in a second direction, which intersects the first direction, and electrically connected to one another; and
first pressure sensing electrodes and second pressure sensing electrodes separated from each other and disposed in the openings of the first touch electrodes in a plan view, wherein the first pressure sensing electrodes and second pressure sensing electrodes are spaced apart from the first touch electrodes,
wherein the first pressure sensing electrodes, the second pressure sensing electrodes, the first touch electrodes, and the second touch electrodes are each in direct contact with the thin film encapsulation layer.

* * * * *